(12) United States Patent
Kawasaki et al.

(10) Patent No.: US 7,538,047 B2
(45) Date of Patent: May 26, 2009

(54) METHOD OF MANUFACTURING SEMICONDUCTOR DEVICE

(75) Inventors: Atsuko Kawasaki, Yokohama (JP);
Takeshi Hoshi, Yokohama (JP);
Masahiro Kiyotoshi, Sagamihara (JP);
Takatoshi Ono, Odawara (JP);
Yoshihiro Ogawa, Yokohama (JP);
Kaori Umezawa, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 264 days.

(21) Appl. No.: 11/451,519

(22) Filed: Jun. 13, 2006

(65) Prior Publication Data
US 2007/0004170 A1    Jan. 4, 2007

(30) Foreign Application Priority Data
Jun. 14, 2005   (JP) ............................. 2005-173974
Jun. 8, 2006    (JP) ............................. 2006-159169

(51) Int. Cl.
*H01L 21/469* (2006.01)

(52) U.S. Cl. ...................................... 438/787; 438/782
(58) Field of Classification Search ................ 438/782, 438/787
See application file for complete search history.

(56) References Cited

U.S. PATENT DOCUMENTS

| 2006/0281336 | A1* | 12/2006 | Arisumi et al. ............. 438/787 |
| 2007/0238294 | A1* | 10/2007 | Beyer et al. ................. 438/687 |
| 2007/0281498 | A1* | 12/2007 | Lee et al. .................... 438/782 |

FOREIGN PATENT DOCUMENTS

| JP | 2790163 | 6/1998 |
| JP | 3178412 | 4/2001 |
| JP | 2005-45230 | 2/2005 |

OTHER PUBLICATIONS

Heo et al., "Void Free and Low Stress Shallow Trench Isolation Technology Using P-SOG for Sub 0.1 um Device", 2002 Symposium on VLSI Technology Digest of Technical Papers, 2 sheets, (2002).

* cited by examiner

*Primary Examiner*—Bradley K Smith
(74) *Attorney, Agent, or Firm*—Finnegan, Henderson, Farabow, Garrett & Dunner, L.L.P.

(57) ABSTRACT

A method of manufacturing a semiconductor device includes forming a trench for isolation on a surface of a substrate including a semiconductor substrate, filling the trench with a solution containing a perhydrosilazane polymer by applying the solution on the substrate, converting the solution into a film containing the perhydrosilazane polymer by heating the solution, and converting the film into a silicon dioxide film including heating the film at a first temperature in an atmosphere containing vapor, and heating the film heated at the first temperature at a second temperature lower than the first temperature in an atmosphere containing vapor or in pure water.

28 Claims, 19 Drawing Sheets

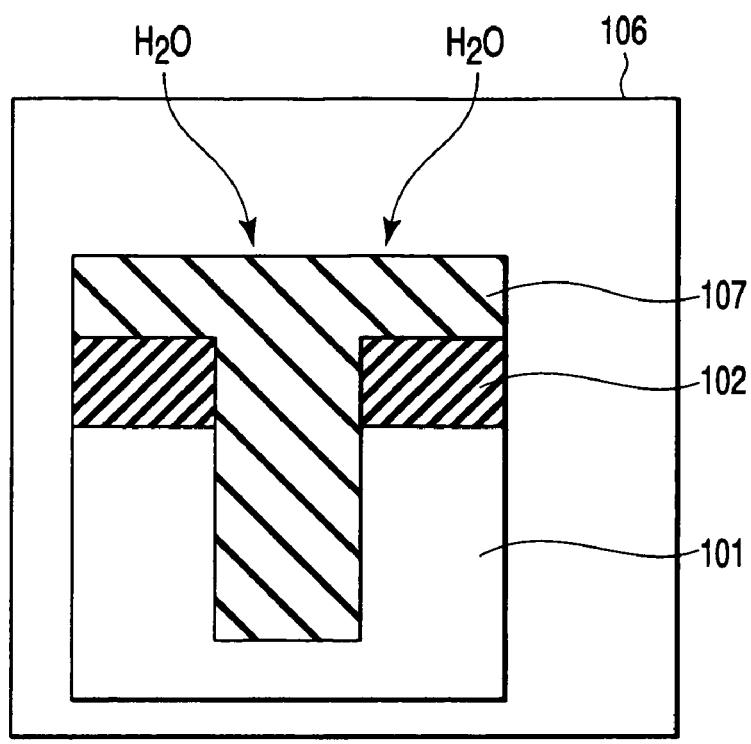
F I G. 4
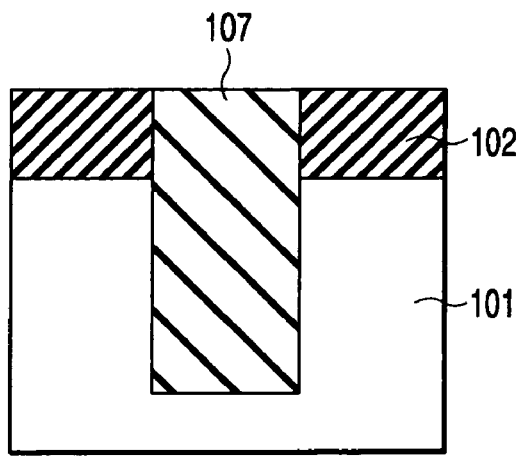
F I G. 5

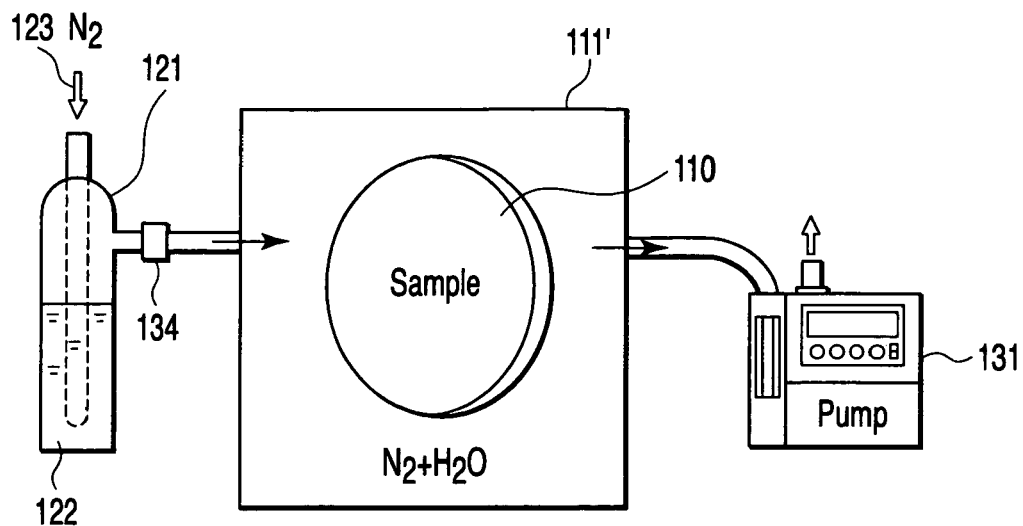
F I G. 1 1
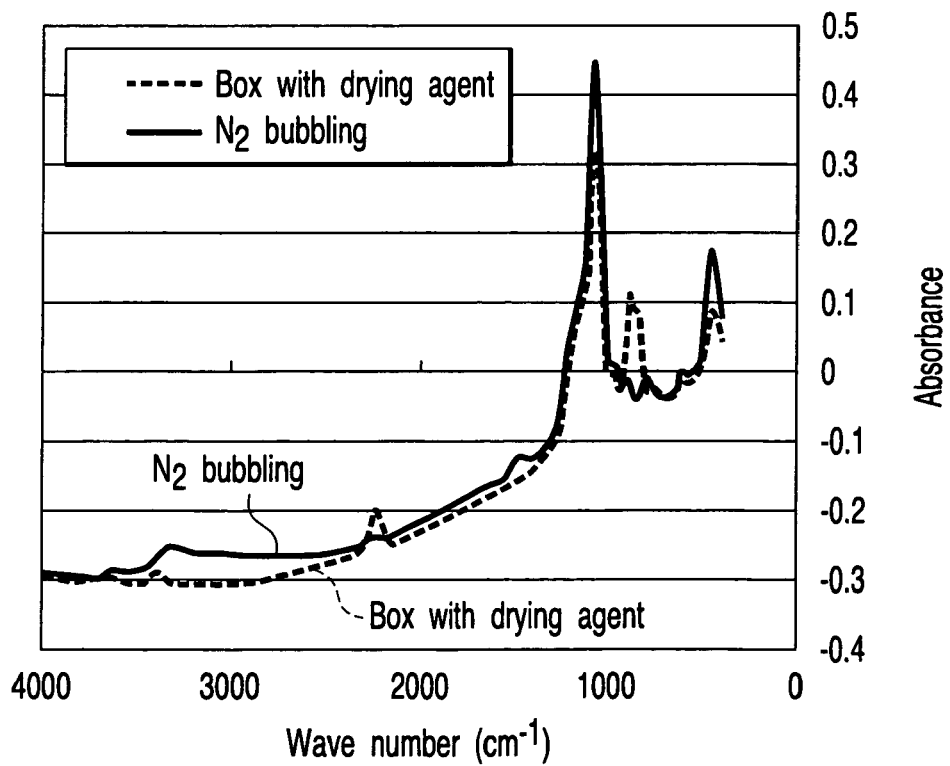
F I G. 1 2

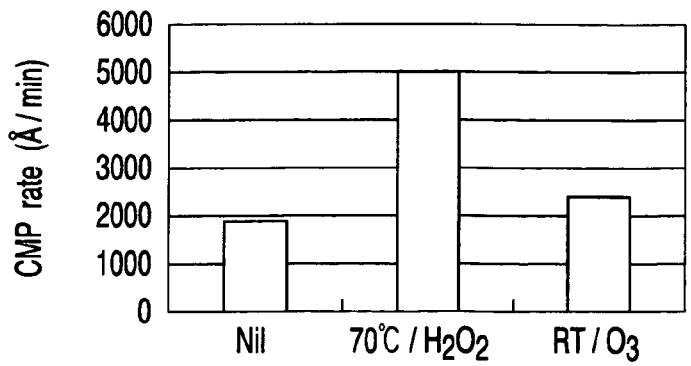
FIG. 15
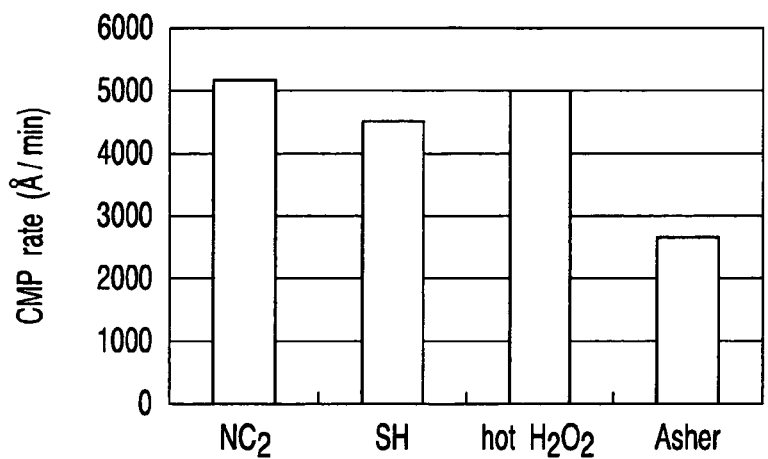
FIG. 16
| PSZ coating Film thickness | Oxidation conditions | Wet temperature | H₂O₂ concentration | Wet etching rate |
|---|---|---|---|---|
| 600nm | 300°C 30 minutes | Room temperature | 0.50% | 28.9 |
| | | 70°C | 1% | 21.7 |
| | | Room temperature | 1% | 28.1 |
| | | 70°C | 0.50% | 21.7 |
| | | 70°C | Nil | 20.6 |
FIG. 17

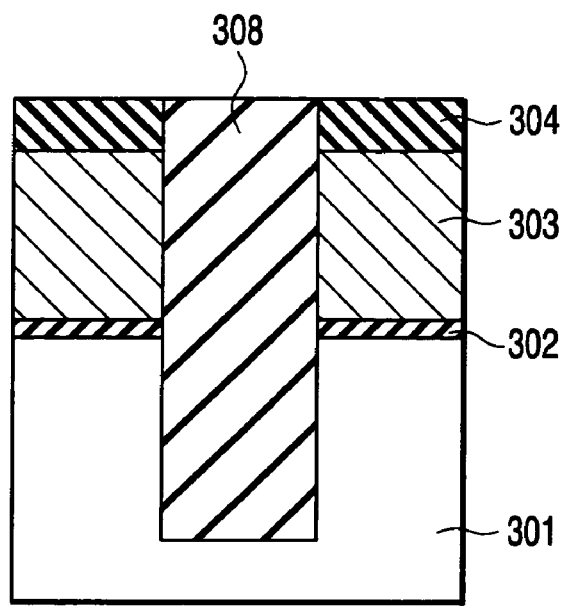
F I G. 27
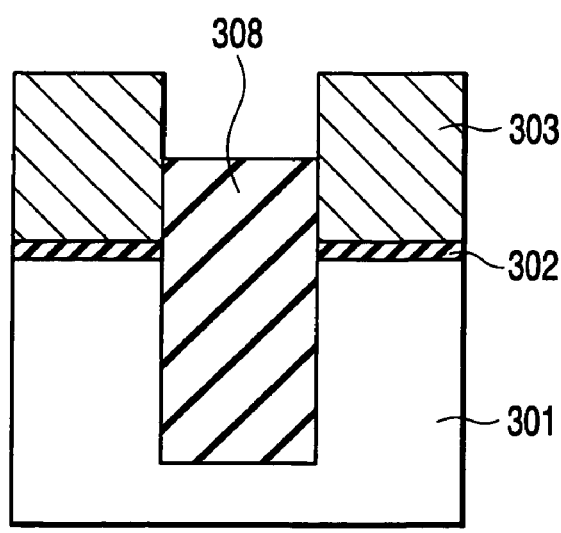
F I G. 28

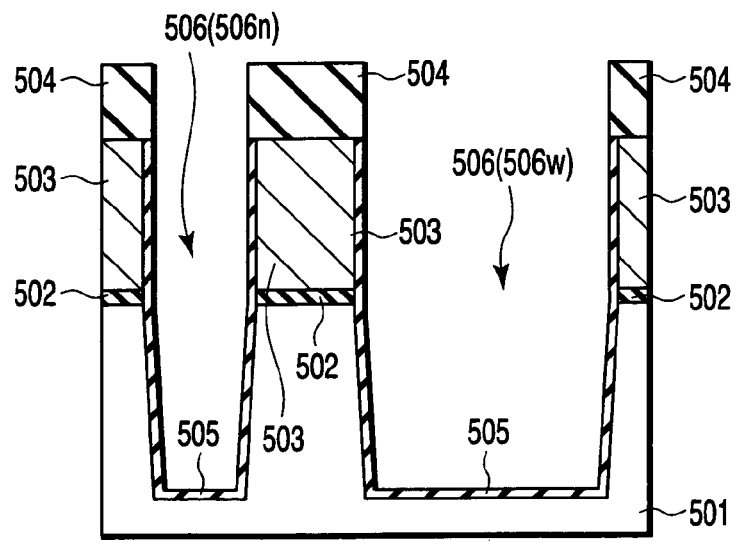
F I G. 3 6
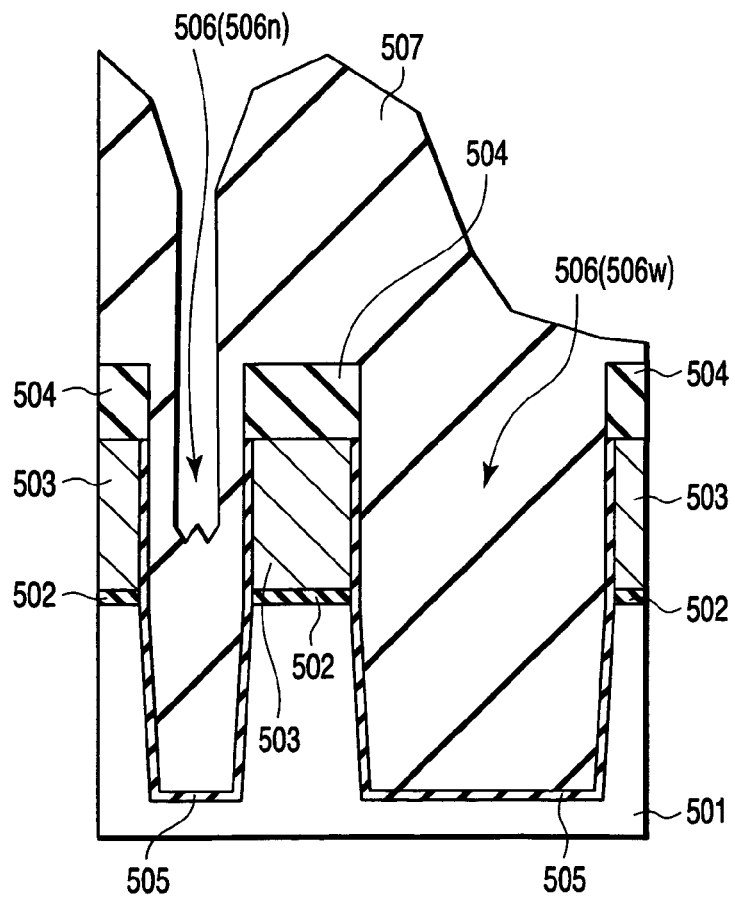
F I G. 3 7

METHOD OF MANUFACTURING SEMICONDUCTOR DEVICE

CROSS-REFERENCE TO RELATED APPLICATIONS

This application is based upon and claims the benefit of priority from prior Japanese Patent Applications No. 2005-173974, filed Jun. 14, 2005; and No. 2006-159169, filed Jun. 8, 2006, the entire contents of both of which are incorporated herein by reference.

BACKGROUND OF THE INVENTION

1. Field of the Invention

The present invention relates to a method of manufacturing a semiconductor device, which includes forming a silicon dioxide film for isolation using a solution containing a perhydrosilazane polymer.

2. Description of the Related Art

In a semiconductor device, a shallow trench isolation (STI) structure is widely used for isolation between minute devices. A process of the STI structure includes a step of forming a trench on the surface of a semiconductor substrate, and a step of filling the trench with an insulating film. The insulating film is, for example, a silicon oxide film. As a process for forming the silicon oxide film, a CVD process using a source gas containing ozone ($O_3$) and TEOS and a high concentration plasma (HDP) CVD process are known.

Accompanied with miniaturization of semiconductor devices, an aspect ratio of the trench becomes larger. For this reason, in the foregoing CVD process or the like, it has become difficult to form the silicon oxide film which does not generate a void and a seam in the trench. That is, it has become difficult to form the silicon dioxide film for STI having a favorable filling shape.

Hence, in the minute semiconductor devices subsequent to the 100 nm generation, a process using a coating type solution SOG (Spin-On-Grass) has been proposed (Void Free and Low Stress Shallow Trench Isolation Technology using P-SOG for sub 0.1 μm device (J. H. Heo et al., 2002 Symposium on VLSI Technology Digest of Technological Papers, pp. 132-133, 2002).

As the SOG solution, a solution (silicon hydroxide solution) obtained by dispersing silicon hydroxide (silanol, $SiOH_4$) into an organic solvent such as alcohol is commonly used.

By applying the silicon hydroxide solution on the semiconductor substrate, a coating film of the silicon hydroxide solution is formed on the semiconductor substrate. Thereafter, the coating film is heated to generate hydrolysis and anhydration condensation reactions. In this manner, the coating film is converted into the silicon dioxide film.

In the processes of the hydrolysis and anhydration condensation reactions, a large volume shrinkage arises. As a result, a crack occurs in the silicon oxide film in the trench. That is, even by using the silicon hydroxide solution, it has become difficult to form the silicon dioxide film for STI having the favorable filling shape.

Hence, in recent years, a perhydrogenated silazane solution having a relatively few volume shrinkage among solutions of the SOG system has come to draw attention (Japanese Patent No. 3178412)

However, even the silicon dioxide film formed by using such the perhydrogenated silazane solution is not satisfactorily as a silicon dioxide film for isolation under the present circumstances.

BRIEF SUMMARY OF THE INVENTION

According to an aspect of the present invention, there is provided a method of manufacturing a semiconductor device comprising: forming a trench for isolation on a surface of a substrate including a semiconductor substrate; filling the trench with a solution containing a perhydrosilazane polymer by applying the solution on the substrate; converting the solution into a film containing the perhydrosilazane polymer by heating the solution; and converting the film into a silicon dioxide film including heating the film at a first temperature in an atmosphere containing vapor, and heating the film heated at the first temperature at a second temperature lower than the first temperature in an atmosphere containing vapor or in pure water.

According to another aspect of the present invention, there is provided a method of manufacturing a semiconductor device comprising: forming a tunnel insulating film, a conductive film to be processed into a floating gate electrode, and a silicon nitride film on a semiconductor substrate sequentially; forming the floating gate electrode and a trench for isolation on a surface of the semiconductor substrate by etching the silicon nitride film, the conductive film, and the tunnel insulating film; filling the trench with a solution containing a perhydrosilazane polymer by applying the solution on a semiconductor structure including the silicon substrate, the tunnel insulating film, the floating gate electrode and the silicon nitride film; converting the solution into a film containing a perhydrosilazane polymer by heating the solution; and converting the film into a silicon dioxide film including heating the film at a first temperature in an atmosphere containing vapor; and heating the film heated at the first temperature at a second temperature lower than the first temperature in an atmosphere containing vapor or in pure water.

BRIEF DESCRIPTION OF THE SEVERAL VIEWS OF THE DRAWING

FIG. 4 is a sectional view showing a step of manufacturing the semiconductor device according to the first embodiment continued to FIG. 3;

FIG. 5 is a sectional view showing a step of manufacturing the semiconductor device according to the first embodiment continued to FIG. 4;

FIG. 11 is a view for explaining an experimental apparatus for oxidizing a wafer with a SiO₂ film only by H₂O;

FIG. 12 is a view showing the result of an IR measurement of the ware with the SiO₂ film oxidized only by O₂ and the ware with the SiO₂ film oxidized only by H₂O;

FIG. 15 is a view showing CMP rate of a PSZ film oxidized by a solution containing an oxidizing agent and a PSZ film not oxidized;

FIG. 16 is a view showing CMP rates of four PSZ oxide films different in oxidization treatment;

FIG. 17 is a view showing a inspection result of dependency of wet etching rate of a PSZ film oxidized by warm water on a temperature of the warm water and an H₂O₂ concentration in the warm water;

FIG. 27 is a sectional view showing a step of manufacturing the semiconductor device according to the third embodiment continued to FIG. 26;

FIG. 28 is a sectional view showing a step of manufacturing the semiconductor device according to the third embodiment continued to FIG. 27;

FIG. 36 is a sectional view showing a step of manufacturing a semiconductor device according to a seventh embodiment of the present invention;

FIG. 37 is a sectional view showing a step of manufacturing the semiconductor device according to the seventh embodiment continued to FIG. 36;

DETAILED DESCRIPTION OF THE INVENTION

Figure 1:
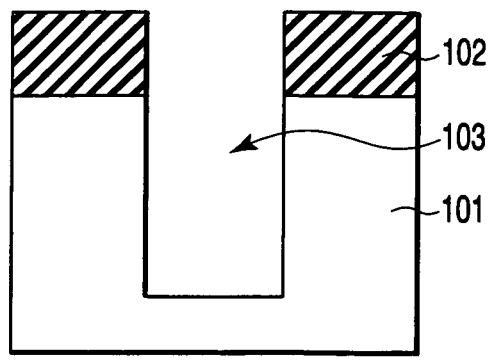
FIG. 1 is a sectional view showing a step of manufacturing a semiconductor device according to a first embodiment of the present invention.

Embodiments of the present invention will be described below with reference to the accompanying drawings.

First Embodiment

FIGS. 1 to 5 are sectional views showing a step of manufacturing a semiconductor device according to a first embodiment of the present invention.

[FIG. 1]

A $Si_3N_4$ film 102 is formed on a silicon substrate 101. The $Si_3N_4$ film 102 is used as a chemical mechanical polishing (CMP) stopper (polishing stopper) at the time of CMP. The thickness of the $Si_3N_4$ film 102 is, for example, about 200 nm. By using an ordinary lithography process and reactive ion etching (RIE) process, the $Si_3N_4$ film 102 and the silicon substrate 101 are processed sequentially. In this manner, a trench (isolation trench) 103 for STI is formed on a surface of the silicon substrate 101. The size of the trench 103 is, for example, about 100 nm in width and about 400 nm in depth.

[FIG. 2]

To completely fill the trench 103, a solution (perhydrogenated silazane solution) containing a perhydrosilazane polymer (($SiH_2NH$)n) is applied on the entire surfaces of the silicon substrate 101 and the $Si_3N_4$ film 102. The application of the perhydrogenated silazane solution is performed by using, for example, a spin-coating method. The perhydrogenated silazane solution is, for example, applied in thickness of about 600 nm. The applied perhydrogenated silazane solution (coating film) is subjected to a baking treatment at 200° C. or lower, for example, about 150° C. for about 3 minutes. By this baking treatment, a solvent of the perhydrogenated silazane solution is vaporized, and a polysilazane (hereinafter referred to as PSZ) film 104 is formed.

[FIG. 3]

The PSZ film 104 is subjected to an oxidation treatment (first oxidation treatment) for about 30 minutes in a vapor atmosphere at a temperature of higher than 200° C. and not less than 600° C., for example, 300° C. This oxidation treatment allows the PSZ film 104 to be converted into a SiO₂ film 105.

Figure 6:
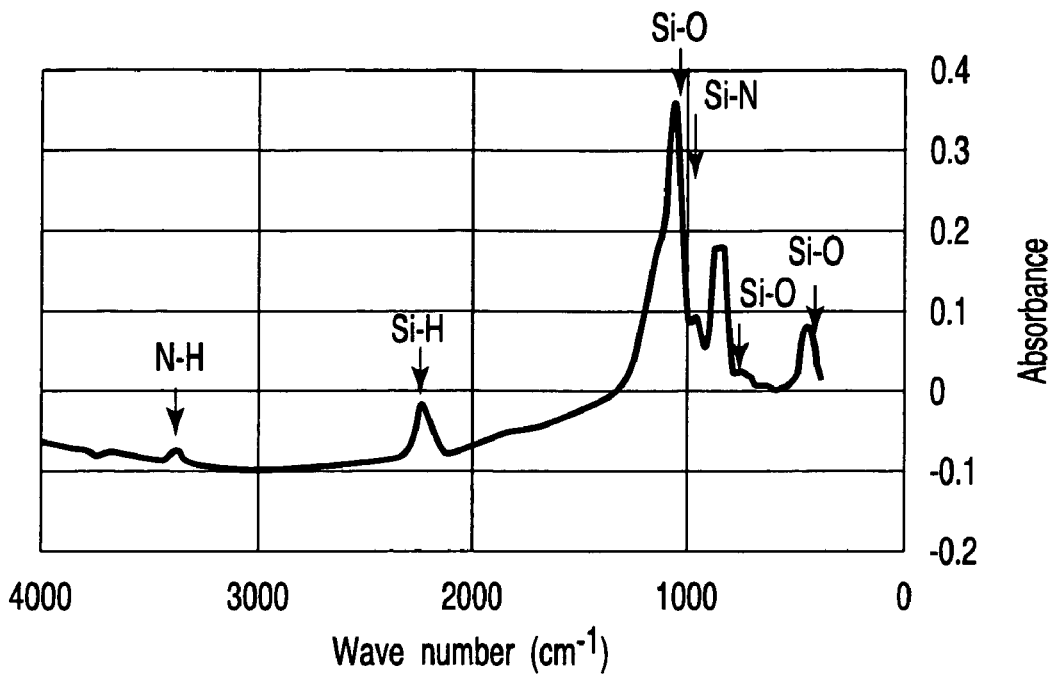
FIG. 6 is a view showing an IR measurement result of a PSZ film subjected to an oxidation treatment in a vapor atmosphere at 600° C. or lower.

Here, the temperature of the oxidation treatment in the vapor atmosphere is set to 300° C. However, in the case where the temperature of the oxidation treatment is low, i.e., 400° C. or lower, it has been found out that Si—H, N—H, Si—N or the like remain in the $SiO_2$ film 105 as a result of an infra-red absorbing method (IR) measurement as shown in FIG. 6. That is, the $SiO_2$ film 105 is not a perfect $SiO_2$ film.

Figure 7:
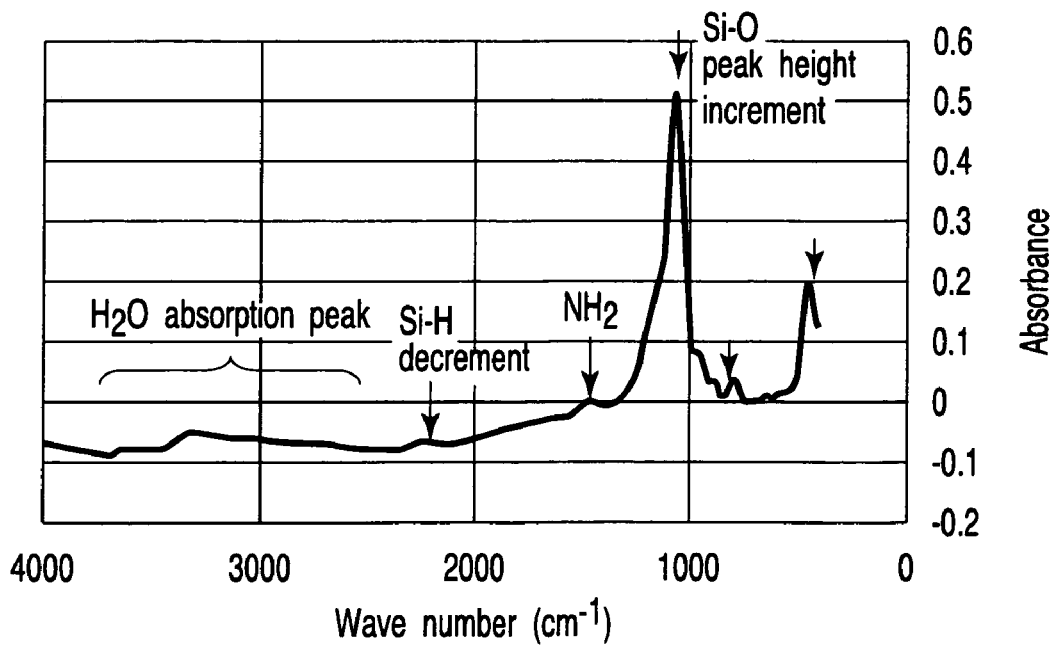
FIG. 7 is a view showing an IR measurement result of a PSZ film subjected to an oxidation treatment in a vapor atmosphere at 600° C. or lower and left in the air.
Figure 8:
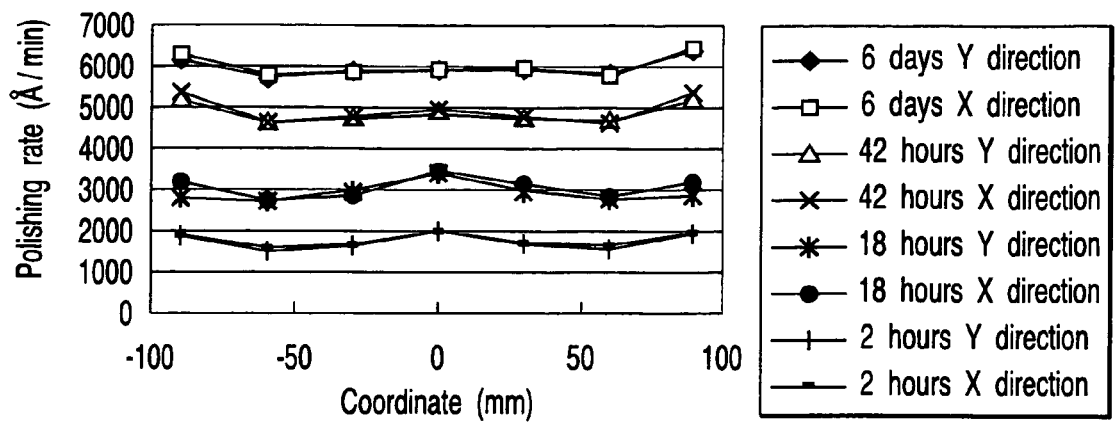
FIG. 8 is a view showing a relationship between CMP rate and a time left in the air of the PSZ film subjected to the oxidation treatment in the vapor atmosphere.

For this reason, if the $SiO_2$ film 105 is left in the air, the $SiO_2$ film 105 gradually reacts with $H_2O$ of the air, and the oxidation of the $SiO_2$ film 105 progresses. If the $SiO_2$ film 105 is left in the air, the $SiO_2$ film 105 is converted into the perfect $SiO_2$ film ($SiO_2$ film having few residual materials such as Si—H or the like) as a result of the IR measurement as shown in FIG. 7. Further, as shown in FIG. 8, during conversion of the $SiO_2$ film 105 into the perfect $SiO_2$ film, a polishing rate of CMP (CMP rate) is largely changed.

The large change of the CMP rate causes a big problem about controlling a shape of a minute device. The CMP rate of the $SiO_2$ film 105 immediately after the oxidation (two hours after the oxidation) is very slow such as about 150 nm/min. This is only about ten times the CMP rate (15 nm/min) of the $Si_3N_4$ film 102 which is a CMP stopper of the $SiO_2$ film used in the ordinary CMP process. For this reason, the $SiO_2$ film 105 is hardly distinguishable from the $Si_3N_4$ film 102, and it is not possible to detect an endpoint of CMP on the $Si_3N_4$ film 102.

Figure 9:
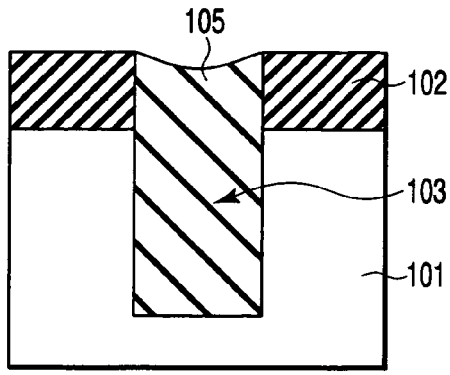
FIG. 9 is a sectional view showing an STI trench after CMP in the case where CMP rate of a $SiO_2$ film for a $Si_3N_4$ film is insufficient.

To detect the endpoint of CMP on the $Si_3N_4$ film 102, the $SiO_2$ film 105 is required to have CMP rate not smaller than 20 times the $Si_3N_4$ film 102. The detection of endpoint of CMP is carried out under time management in which polishing time is set to a constant value. According to the increase in elapsed time after the oxidation treatment, the CMP rate of the $SiO_2$ film 105 becomes large. For this reason, if the detection of the endpoint of CMP is carried out under the time management, the $SiO_2$ film 105 is polished more than necessary. As a result, as shown in FIG. 9, a concavity is generated in the trench 103. That is, a STI structure having a precise shape is not formed.

The present inventors have confirmed the fact that $H_2O$ in the air and the $SiO_2$ film 105 gradually react with each other in the following manner.

Among the materials included in the air, $H_2O$ and $O_2$ are considered to promote the oxidation of the $SiO_2$ film 105. Hence, the following experiment was conducted.

First, two wafers with $SiO_2$ film are prepared. The wafer with $SiO_2$ film is fabricated as follows. A perhydrogenated silazane solution is applied on a silicon substrate (Si wafer) in thickness of about 600 nm by a spin-coating method. No trench is formed on a surface of the silicon substrate. That is, the surface of the silicon substrate is flat.

Next, by performing a baking treatment for 3 minutes at 150° C., a solvent of the perhydrogenated silazane solution is vaporized. Further, by performing an oxidation treatment for 30 minutes at 300° C. in the vapor atmosphere, the perhydrogenated silazane solution is converted into a $SiO_2$ film. This $SiO_2$ film is not yet a perfect $SiO_2$ film.

Figure 10:
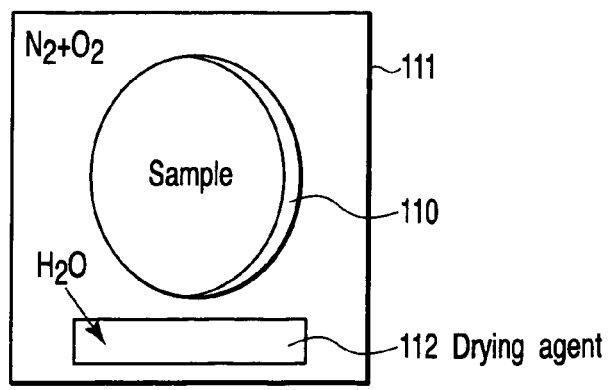
FIG. 10 is a view for explaining an experimental apparatus for oxidizing a wafer with a $SiO_2$ film only by $O_2$.

Next, as shown in FIG. 10, one of two wafers (samples) 110 with the $SiO_2$ film is stored for two days in a sealed BOX 111 containing nitrogen ($N_2$) and oxygen ($O_2$). A drying agent 112 is provided in the sealed BOX 111. $H_2O$ in the sealed BOX 111 is absorbed into the drying agent 112. Consequently, only oxidation by $O_2$ is developed in the wafer 110 with the $SiO_2$ film stored in the sealed BOX 111.

The other wafer (sample) 110 with the $SiO_2$ film, as shown in FIG. 11, is stored for two days in a BOX 111' comprising a $N_2$ bubbling mechanism. The $N_2$ bubbling mechanism includes an impinger 121, a gas supply mechanism (not shown) for supplying a $N_2$ gas into the impinger 121, and a pump device 131 for exhausting the $N_2$ gas inside the BOX 111' to the outside.

Prior to using the $N_2$ bubbling mechanism, a constant quantity of pure water 122 is poured into the impinger 121 in advance. The impinger 121 is connected to the BOX 111' via a valve 134. Nitrogen gas is supplied into the impinger 121 by the gas supply mechanism, so that the bubbled pure water 122 is generated, and the bubbled pure water 122 and nitrogen gas are supplied into the BOX 111'. Since the pump device 131 is provided in the BOX 111', oxidation is developed in the wafer 110 with the $SiO_2$ film only by $H_2O$.

In FIG. 12 is shown a result of the IR measurement of the two wafers 110 with the $SiO_2$ film after being left for two days.

In the case of the BOX 111 (BOX containing the drying agent), an IR spectrum after being left for two days does not change, even if compared with the IR spectrum immediately after the oxidation at 300° C.

On the other hand, in the case of the BOX 111' ($N_2$ bubbling), an IR spectrum after being left for two days is equivalent to the IR spectrum of the wafer with the $SiO_2$ film after being left for five days. From this, it is turned out that the $SiO_2$ film is converted into a more perfect $SiO_2$ film by reacting gradually with $H_2O$ in the air.

To convert the $SiO_2$ film of the sample 110 to which nothing but an imperfect oxidation is performed in the vapor atmosphere, into a perfect $SiO_2$ film which can be polished at high rate by CMP, an oxidation treatment (first oxidation treatment) is first performed in the vapor atmosphere. The oxidation treatment is performed in an oxidative furnace. An oxidation temperature (furnace temperature) is 300° C.

Next, by lowering the furnace temperature to 150° C. and leaving the sample 110 in the vapor atmosphere for 15 minutes, the $SiO_2$ film is further subjected to an oxidation treatment (second oxidation treatment) in the vapor atmosphere.

The $SiO_2$ film of the sample 110 obtained through the first and second oxidation treatments was subjected to CMP. The CMP rate of the $SiO_2$ film was high such as 400 nm/min. The $SiO_2$ film is formed on the wafer whose surface is flat. If the $SiO_2$ film has a high CMP rate of 400 nm/min, it can be used as an insulating film for STI having a trench formed on the surface. That is, if this $SiO_2$ film is used, it is possible to detect the endpoint of CMP on the $Si_3N_4$ film 102 (CMP stopper).

[FIG. 4]

Figure 3:
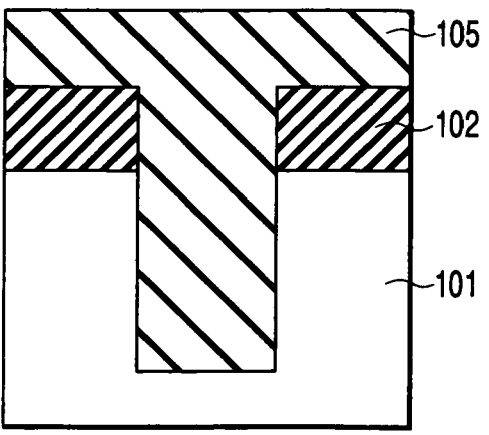
FIG. 3 is a sectional view showing a step of manufacturing the semiconductor device according to the first embodiment continued to FIG. 2.

In consideration of the foregoing experimental result or the like, in the present embodiment, the $SiO_2$ film 105 is subjected to the oxidation treatment (second oxidation treatment) of 150° C. in a vapor atmosphere 106 after the step of FIG. 3. As a result, the $SiO_2$ film 105 is converted into the perfect $SiO_2$ film 107.

[FIG. 5]

Using the $Si_3N_4$ film 102 as a CMP stopper, the $SiO_2$ film 107 outside of the trench is polished and the surface is flattened by CMP process. Thereafter, (after isolation), a desired device is formed by a known process, so that a semiconductor device is obtained.

In the present embodiment, the temperature of the oxidation treatment in the vapor atmosphere is set to 300° C., but whatever temperature may be acceptable if it is higher than 200° C. and not higher than 600° C. When the temperature for the oxidation treatment in the vapor atmosphere is 200° C., the conversion from the PSZ film into the $SiO_2$ film becomes imperfect. For this reason, the etching rate of the $SiO_2$ film for the dilute HF becomes very large. In this case, the shape of the $SiO_2$ film is totally uncontrollable.

Further, in the case where a process (gate prefabricated structure) in which a tunnel gate oxide film (thin silicon oxide film) is formed earlier than a gate electrode is adopted as a process for NAND type flash memory, the thickness of the tunnel gate oxide film is increased when the temperature for the oxidation treatment in the vapor atmosphere is 600° C. or higher. The increase in the thickness of the tunnel gate oxide film brings about fluctuation of a threshold value voltage. The fluctuation of the threshold value voltage deteriorates device characteristics.

On the other hand, in the case where the gate prefabricated structure is not adopted, when the STI width is a design of 50 nm or lower, that is, when both of the STI width and an active area width are 50 nm or less, an STI side wall is oxidized to expand the STI width if the temperature is 600° C. or higher. On the other hand, the active area width is narrowed by a portion by which the STI side wall is oxidized. That is, the STI width and the active area width having the design are not obtained, so that a device having designed characteristics is not manufactured.

As described above, according to the present embodiment, use of the perhydrogenated silazane solution makes it possible to easily form a $SiO_2$ film effective as the insulating film for isolation, particularly a $SiO_2$ film having large CMP rate as compared with the $Si_3N_4$ film (CMP stopper).

Particularly, the $SiO_2$ film is effective as a silicon dioxide film for isolation of a semiconductor device comprising a fine elemental semiconductor device subsequent to the 100 nm generation and furthermore subsequent to the 50 nm generation.

Second Embodiment

Figure 13:
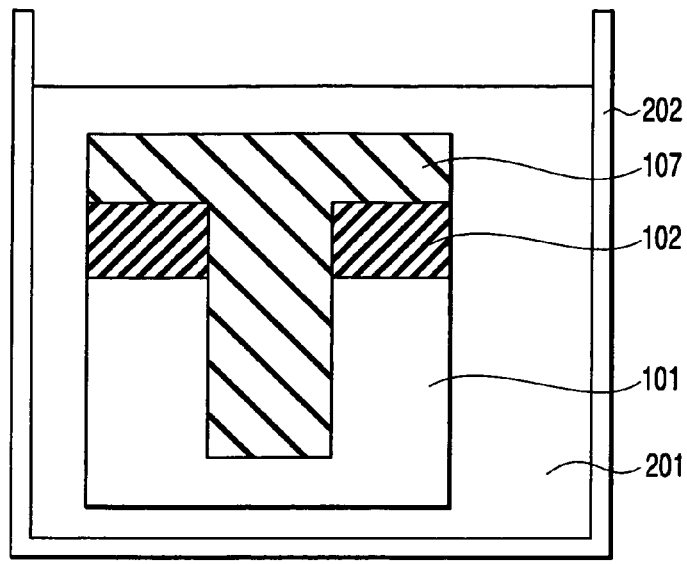
FIG. 13 is a sectional view showing a step of manufacturing a semiconductor device according to a second embodiment of the present invention.

FIG. 13 is a sectional view showing a step of manufacturing a semiconductor device according to a second embodiment of the present invention. Incidentally, in the following drawings, the parts corresponding to the already described drawings will be attached with reference numerals same as those of the already described drawings, and the detailed description thereof will be omitted.

Figure 2:
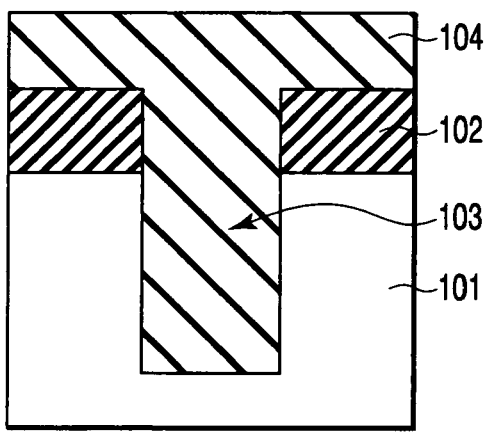
FIG. 2 is a sectional view showing a step of manufacturing the semiconductor device according to the first embodiment continued to FIG. 1.

First, the steps of FIGS. 1 to 3 described in the first embodiment are performed. A $SiO_2$ film 105 at this stage, as described above, is a $SiO_2$ film obtained without performing sufficient oxidation to the PSZ film 104. Therefore, CMP rate of the $SiO_2$ film 105 is insufficient.

In the first embodiment, the oxidation treatment is performed for converting the $SiO_2$ film 105 into the $SiO_2$ film 107 by exposing the $SiO_2$ film 105 subjected to the first oxidation treatment in the vapor atmosphere. In the present embodiment, the oxidation treatment for converting the $SiO_2$ film 105 into the $SiO_2$ film 107 is performed by immersing the $SiO_2$ film 105 into warm water 201, as shown in FIG. 13. The temperature of the warm water 201 (heat treatment temperature) is lower than the temperature of the first oxidation treatment.

A container 202 for storing the warm water is not particularly limited, and for example, a known container used for cleaning process can be used.

The sample 110 described in the first embodiment was immersed in the warm water at 70° C. for 10 minutes, thereafter, CMP of a $SiO_2$ film of the sample 110 was performed. As a result, the CMP rate of the $SiO_2$ film was 450 nm/min. If a $SiO_2$ film has a high CMP rate of 450 nm/min, it can be used as an insulating film for STI having a trench formed on the surface. That is, if the $SiO_2$ film is used, the endpoint of CMP can be detected on the $Si_3N_4$ film 102 (CMP stopper).

Actually, in case the $SiO_2$ film 105 oxidized by the warm water, that is, the $SiO_2$ film 107 is used, it is confirmed that the endpoint of CMP can be detected on the $Si_3N_4$ film 102 (CMP stopper). After the step of FIG. 13, the same step as the first embodiment is performed to manufacture a semiconductor device.

The forgoing example is applied to the case of a warm water treatment (heating treatment) with the warm water at 70° C. and 10 minutes of immersion time. With respect to the combinations of temperature and immersion time of (55° C., 8 minutes), (65° C., 8 minutes), (75° C., 8 minutes), (55° C., 15 minutes), (65° C., 15 minutes), and (75° C., 15 minutes), the CMP rate of the $SiO_2$ film after the warm water treatment was checked. Its result is shown in FIG. 14.

Figure 14:
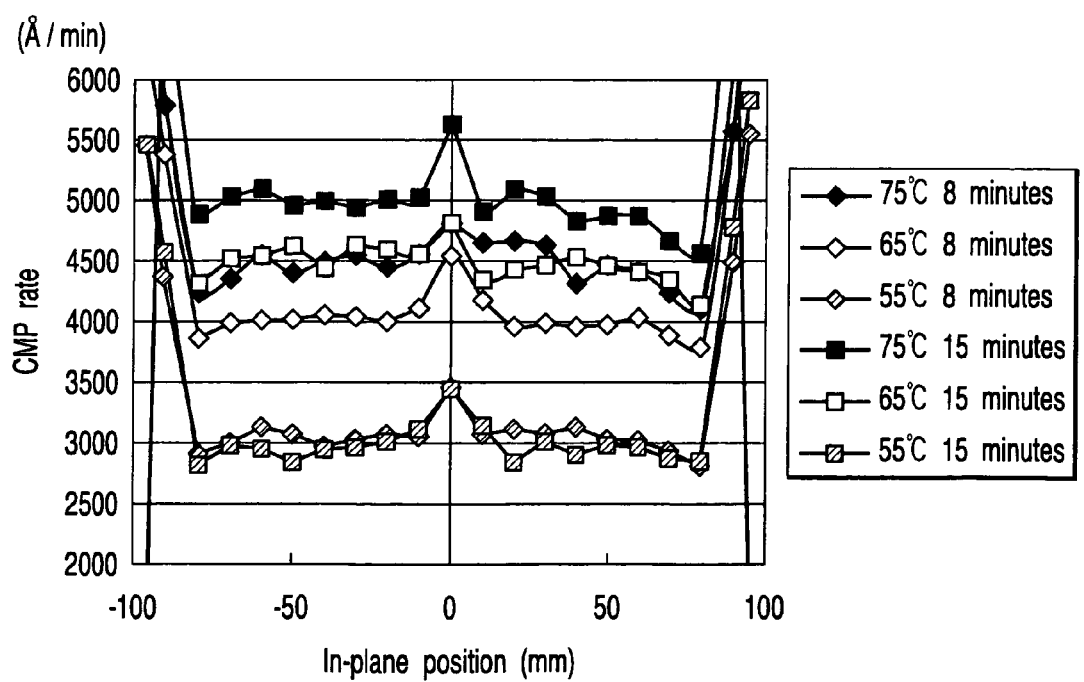
FIG. 14 is a view showing dependency of CMP rate on a warm water temperature and an immersion time.

From FIG. 14, it is turned out that, in the case where the temperature of the warm water is 55° C., the CMP rate of the $SiO_2$ film of the sample 110 is barely twenty times the target CMP rate. In the case where the $SiO_2$ film having this CMP rate is used as an insulating film for STI, it is possible to detect the endpoint of CMP on the $Si_3N_4$ film 102 (CMP stopper) if CMP time is 15 minutes, but it is not possible to detect the endpoint if CMP time is 8 minutes. That is, a process margin is insufficient if the temperature is 55° C. Consequently, the temperature at least higher than 55° C. is necessary.

Further, from FIG. 14, in a case where the temperature of the warm water is over 65° C., it is turned out that the CMP rate of the $SiO_2$ film of the sample 110 exceeds 350 nm/min regardless of the CMP time. In the case where the $SiO_2$ film having this CMP rate was used as an insulating film for STI, it was possible to detect the endpoint of CMP on the $Si_3N_4$ film 102 (CMP stopper).

Now, in Jpn. Pat. Appln. KOKAI Publication No. 2005-45230, there is disclosed a method of oxidizing a PSZ film baked at a temperature of 400° C. or lower with an oxide solution containing ozone, peroxide, or the like. In contrast to this, an oxidizing method of the present embodiment is to oxidize with pure warm water not containing an oxidizing agent such as ozone and peroxide in the warm water.

That is, different from the oxidizing method of Jpn. Pat. Appln. KOKAI Publication No. 2005-45230, in the present embodiment, the oxidizing agent contained into the oxide solution does not oxidize the PSZ film, but the water or the warm water itself oxidizes the PSZ film.

While checking a mechanism of the oxidation, the present inventors found out that the oxidizing agent such as ozone and $H_2O_2$ was not required, and furthermore, found out that, in the case of the wet treatment solution containing the oxidizing agent, an in-plane distribution of etching by dilute HF solution was deteriorated.

Now, the experiment conducted by the present inventors will be described.

The present inventors prepared three samples for the experiment. The method of fabricating these samples is as follows.

A perhydrogenated silazane solution is applied on a silicon substrate in thickness of 600 nm by spin coating method. Next, a solvent is vaporized by baking at 150° C. for 3 minutes. Finally, by heat treatment at 300° C. for 30 minutes in an atmosphere containing vapor, a PSZ film is converted into a $SiO_2$ film (PSZ oxide film).

One of the three samples is not subjected to any chemical treatment (sample 1).

One of the remaining two samples is immersed in a solution containing a 1% $H_2O_2$ in warm water at 70° C. for about 10 minutes (sample 2).

The last one sample is immersed in a solution containing about 1 ppm of $O_3$ at room temperature (RT) for 20 minutes (sample 3).

Thereafter, the CMP rates of the PSZ oxide films of the samples 1 to 3 were obtained. The result is shown in FIG. 15.

As shown in FIG. 15, the CMP rate of the PSZ oxide film of the sample 3 (RT/$O_3$ 1 ppm) and the CMP rate of the PSZ oxide film of the sample 1 (no chemical treatment performed) are hardly different from each other. Comparing with those, the CMP rate (500 nm/min) of the PSZ oxide film of the sample 2 (70° C./$H_2O_2$ 1 ppm) is about 2.5 times larger than the CMP rate (about 200 nm/min) of the PSZ oxide film of the sample 1. This means that the oxidation of the PSZ oxide film of the sample 2 progresses. From the experiment, the present inventors have determined that $O_3$ does not promote the oxidation of the PSZ oxide film.

Next, the present inventors conducted an experiment to compare oxidation with a solution containing $H_2O_2$ for use in an ordinary semiconductor process and easily triable and oxidation ($O_2$ ashing) with an oxygen radical generally considered as strong in oxidation.

The present inventors prepared four samples for the experiment. The method of fabricating these samples is the same as the fabrication method for the previous three samples.

One of the four samples is subjected to a NC2 treatment (sample 4). The NC2 is a mixed solution containing $H_2O_2$, choline, and water.

One of the remaining three samples is subjected to an SH treatment (sample 5).

One of the remaining two samples is subjected to a hot $H_2O_2$ treatment (immersed in a solution containing a 1% $H_2O_2$ in 0° C. warm water for about 10 minutes) (sample 6).

The last one is subjected to an $O_2$ ashing treatment (general condition used for resist removal) (sample 7).

As shown in FIG. 16, the PSZ oxide films of the sample 4 (NC2 treatment), the sample 5 (SH treatment), and the sample 6 (hot $H_2O_2$ treatment) show high CMP rates such as 450 to 510 (nm/min). In contrast to those, the PSZ oxide film of the sample 7 ($O_2$ ashing treatment) shows a low CMP rate. This means that the oxidation does not progress in the PSZ oxide film of the sample 7. That is, the oxidation of the PSZ oxide film is not promoted by oxygen radical. From the foregoing, it is presumed that a special mechanism is operated in the oxidation of the PSZ oxide film.

As described above, when there exists $H_2O_2$ of high temperature of 70° C. or higher (sample 2), the oxidation of the PSZ oxide film is promoted.

Hence, the present inventors checked which one of the concentration and temperature of $H_2O_2$ promoted the oxidation of the PSZ oxide film, and further checked whether or not absence of $H_2O_2$ generates an oxidation promotional effect of the PSZ oxide film. This was checked by the following experiment.

The present inventors prepared five samples for the experiment. The method of fabricating these samples is the same as the fabrication method for the previous three samples.

One of the five samples is immersed in a solution containing a 5% $H_2O_2$ in warm water of room temperature (sample 8).

One of the remaining four samples is immersed in a solution containing a 1% $H_2O_2$ in warm water of 70° C. (sample 9).

One of the remaining three samples is immersed in a solution containing a 1% $H_2O_2$ in warm water of room temperature (sample 10).

One of the remaining two samples is immersed in a solution containing a 5% $H_2O_2$ in warm water of 70° C. (sample 11).

The last one is immersed in a solution (pure water) containing no $H_2O_2$ in warm water of 70° C. (sample 12).

The time for immersion in the solution is same for each of the five samples.

Next, a wet etching rate of each sample by a dilute HF is measured. As the condition of the dilute HF treatment, a condition of 10 nm etching was selected in the case of a thermal oxidation film.

In FIG. 17 is shown the measurement result of the wet etching rate of each of the samples 8 to 12. In FIG. 17 is also shown the measurement result of the wet etching rate of a sample where there is no warm water treatment as a reference. Here, the wet etching rate shows a value in the case where the wet etching rate of the thermal oxidation film is taken as 1.

As shown in FIG. 17, when the temperature (wet temperature) of the solution containing the pure water is room temperature (low temperature), the wet etching rate is about 28 (about 28 times the etching rate of the thermal oxidation film) and is fast regardless of the concentration of $H_2O_2$.

On the other hand, when the wet temperature is 70° C. (high temperature), the wet etching rate is about 22 and is low regardless of the concentration of $H_2O_2$. This represents that the oxidation of the PSZ oxide film progresses. Here, what is phenomenal is that the wet etching rate is the lowest and measures off 21 in the pure water of 70° C. containing no $H_2O_2$.

Figure 18:
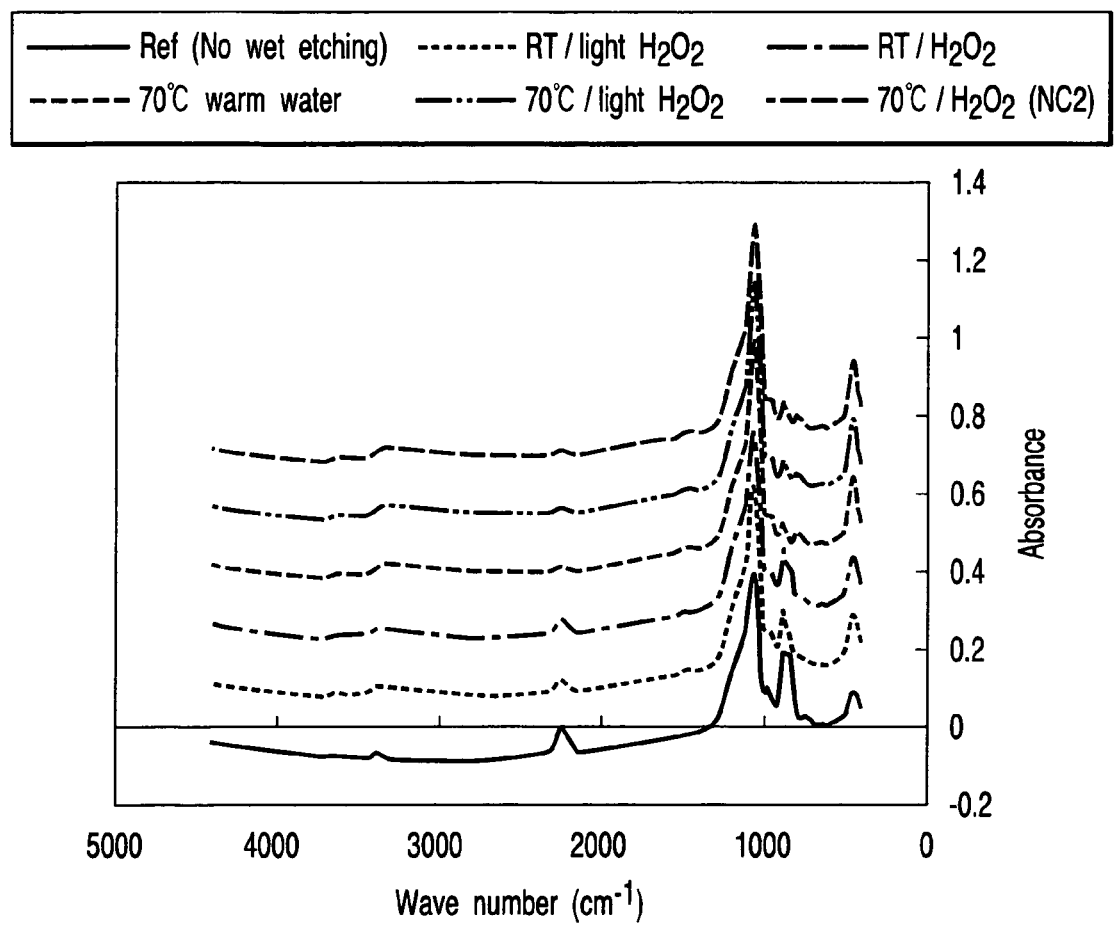
FIG. 18 shows an IR measurement result of six PSZ oxide films different in oxidization treatment.

Further, when the IR measurement of the PSZ oxide films of the samples 8 to 12 was conducted, the result shown in FIG. 18 was obtained.

IR of the sample in which the wet temperature is room temperature, that is, IRs of the sample 8 (RT/0.5% $H_2O_2$) and the sample 10 (RT/1% $H_2O_2$), and further, IR of the reference are high in peaks of Si—H adjacent to 2200 cm$^{-1}$ and Si—H and N—H adjacent to 900 cm$^{-1}$. From this, it is turned out that a number of PSZ structures remain in these samples.

In contrast to this, IR of the sample in which the wet temperature is room temperature, that is, IRs of the sample 9 (70° C./1% $H_2O_2$), the sample 11 (70° C./0.5% $H_2O_2$), and the sample 12 (70° C. warm water) are low in peaks of Si—H and N—H, and are high in peak of Si—O adjacent to 1100 cm$^{-1}$. This represents that oxidation of the PSZ oxide films progress in these samples. Particularly, the sample 12 (70° C. warm water) is much higher in peak of Si—O adjacent to 1100 cm$^{-1}$.

Figure 19:
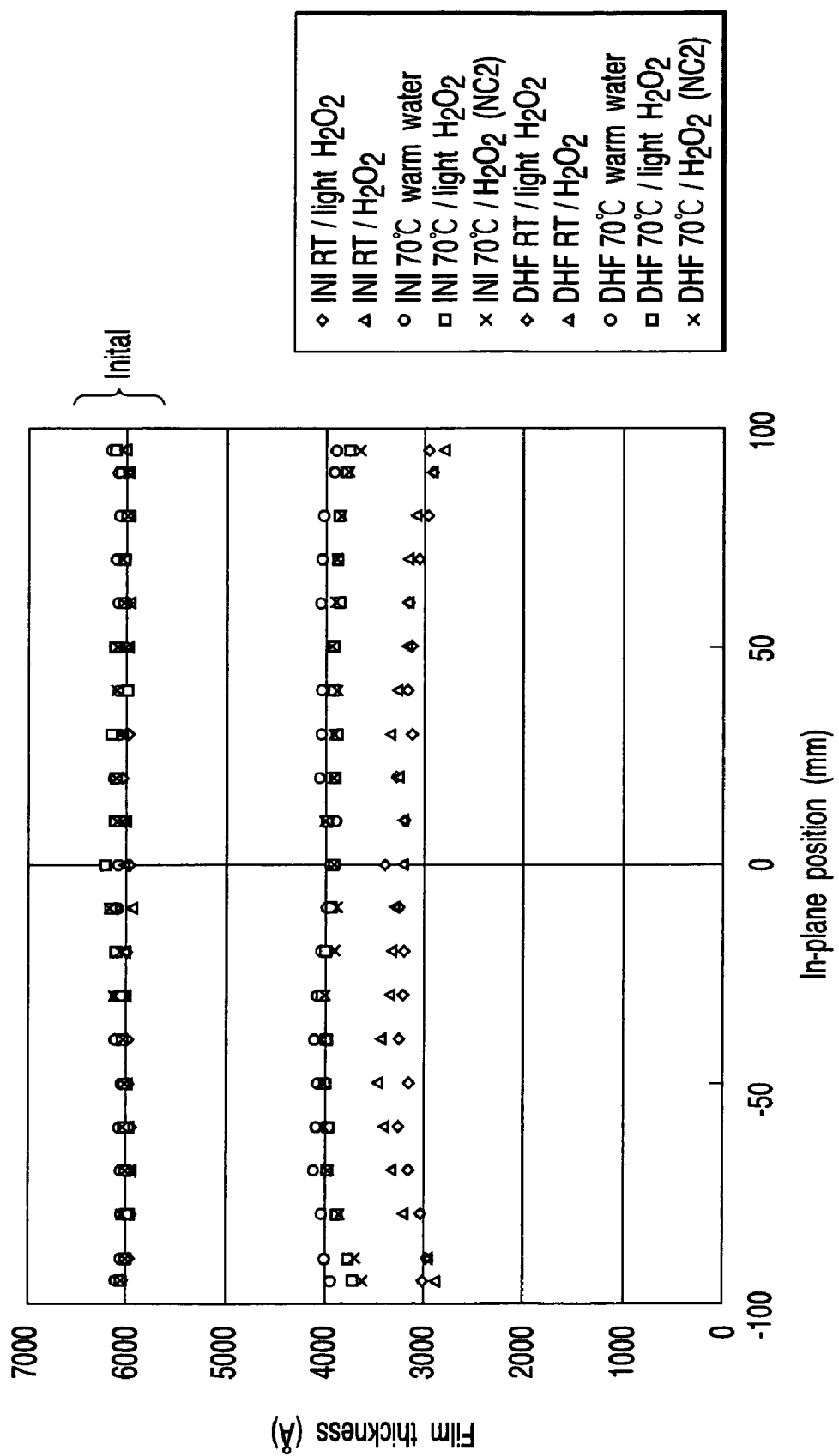
FIG. 19 is a view showing an in-plane uniformity of wet etching rates of the six PSZ oxide films different in oxidization treatment.

FIG. 19 is a view showing an in-plane uniformity of the wet etching rates of the PSZ oxide films of the samples 8 to 12. The wet etching was performed (dilute HF etching) by using DHF (dilute hydrofluoric acid). In FIG. 19, the axis of abscissas shows a distance from the wafer center, and the axis of ordinate shows the thicknesses of the PSZ oxide films of the samples 8 to 12. FIG. 19 shows both of the thickness before the wet etching (Initial) and the thickness after the wet etching.

From FIG. 19, it is turned out that, when comparing the in-plane uniformity of the three samples 2, 4 and 5 in which the wet temperature is 70° C., only the sample 5 immersed in the warm water containing no $H_2O_2$ is good in-plane uniformity.

Figure 20:
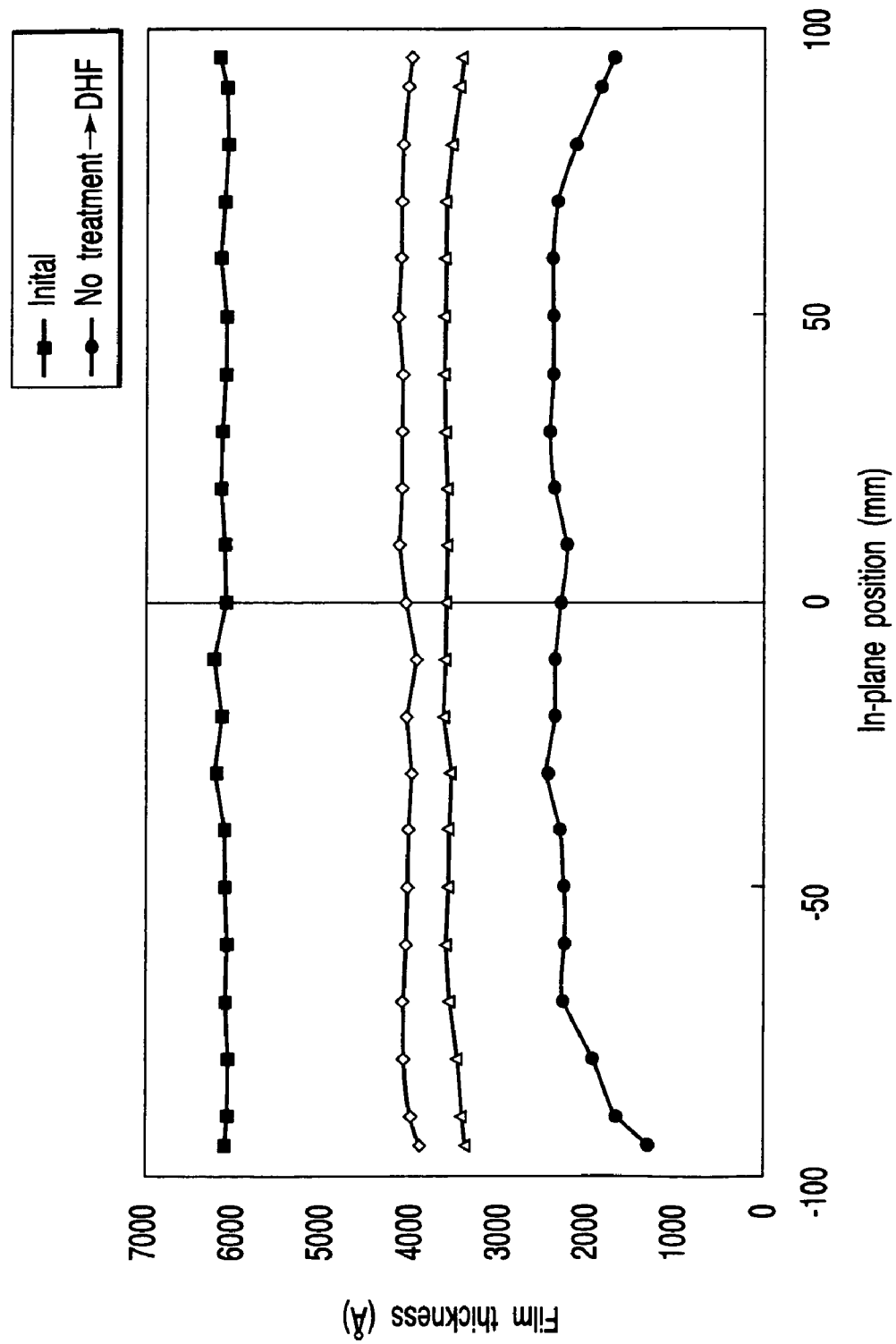
FIG. 20 is a view showing an in-plane uniformity of the etching rates of a plurality of samples shown in FIG. 19 and an in-plane uniformity of the etching rate of a sample not subjected to an wet treatment (warm water heating) but subjected to a dilute HF etching.

FIG. 20 shows an in-plane uniformity of the etching rates of a plurality of samples shown in FIG. 19 and an in-plane uniformity (black rectangle) of the etching rate of a sample not subjected to the wet treatment (warm water heating) but subjected to the dilute HF etching.

In FIGS. 20 and 19, curved lines shown with the same marks show the samples to which the same treatment has been performed. An Initial (Black circle) in FIG. 20 is an average of five Initials in FIG. 19.

It is turned our from FIG. 20 that, when the wet treatment is not performed, the wafer center portion and the wafer peripheral portion are etched, respectively, by about 400 nm and 500 nm. That is, the present inventors have found out that just simple immersion of the PSZ oxide film in the water of room temperature improves the etching rate and the in-plane uniformity.

From the foregoing experiment, it has become clear that, when the PSZ film (PSZ oxide film) subjected to an insufficient oxidation treatment is subjected to the oxidation treatment at a low temperature of 400° C. or lower, the material which promotes the oxidation of the PSZ oxide film is not an oxidizing agent, but $H_2O$.

Next, the present inventors conducted an experiment using a heavy water ($D_2O$) in order to find out a mechanism why the PSZ oxide film is oxidized by water.

First, a sample is prepared. The method of fabricating the sample includes a step of applying a perhydrosilazane polymer solution on a silicon substrate in thickness of 600 nm by spin coating method, a step of converting the perhydrosilazane polymer solution into a PSZ film by vaporizing a solvent by the baking at 150° C. for 3 minutes, and a step of converting the PSZ film into a $SiO_2$ film by the heat treatment at 300° C. for 30 minutes in an atmosphere containing vapor.

Next, the sample is cut into a size of 3 cm×3 cm. The cut sample is immersed in $D_2O$ contained in a Teflon beaker.

The Teflon beaker is held on a hot plate. The temperature of $D_2O$ is adjusted by the hot plate. The temperature of the sample is obtained by measuring the temperature of $D_2O$ in the Teflon beaker.

The sample is heated in $D_2O$ at a predetermined temperature for a predetermined time, thereafter, diffusion of D (heavy hydrogen) in the PSZ oxide film is analyzed by SIMS.

Here, 48° C., 55° C., 65° C., and 75° C. were selected as the predetermined temperature (sample temperature), and 1 minute, 5 minutes, and 10 minutes were selected as the predetermined time (heating time). Consequently, analytical results of 12 pieces (=4×3) are obtained.

Figure 21:
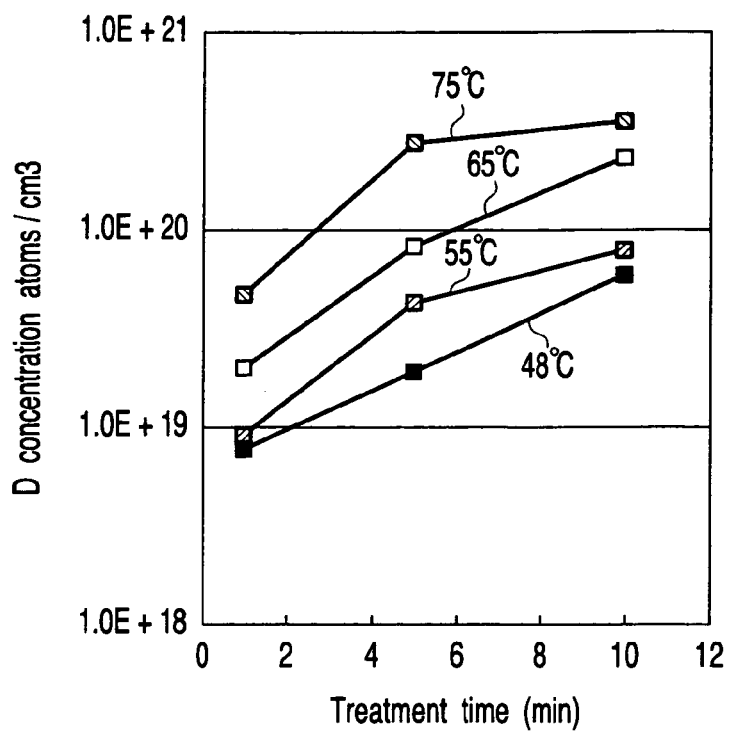
FIG. 21 is a view showing a relationship among a heating temperature, a heating time, and a heavy hydrogen concentration in the PSZ oxide film.

FIG. 21 shows a relationship among the sample temperature (heating temperature), the treatment time (heating time), and the D concentration in the PSZ oxide film, which are obtained based on the analytical result. From FIG. 21, it is turned out that when the heating time and the treatment time are increased, the D concentration is increased.

Figure 22:
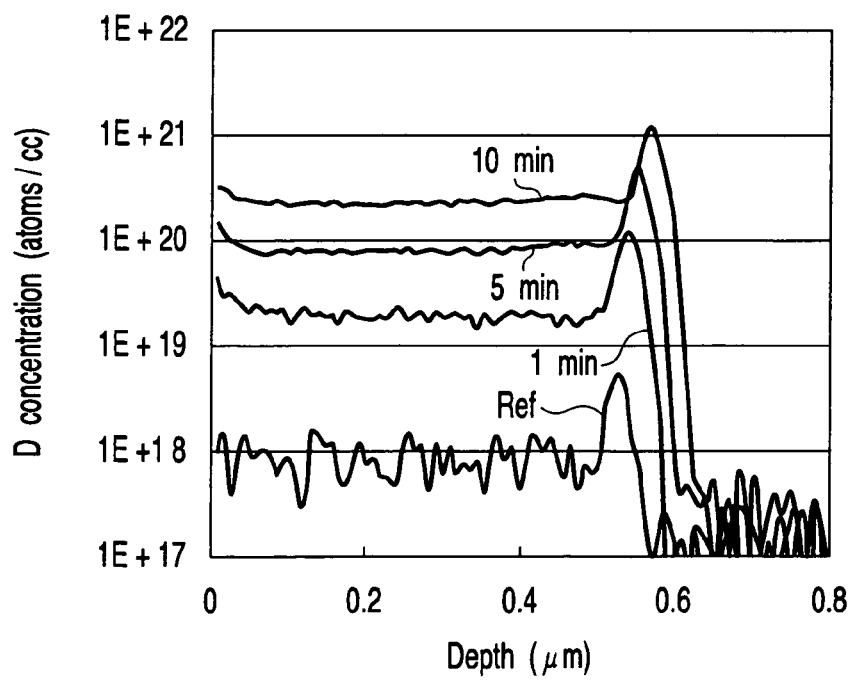
FIG. 22 is a view showing an SIMS profile of the PSZ oxide film in the case where the combinations of the heating temperature and the heating time are (65° C., 1 minute), (65° C., 5 minutes), and (65° C., 10 minutes)

In FIG. 22 is shown SIMS profiles of the PSZ oxide films in the case where the combinations of the heating temperature and the heating time are (65° C., 1 minute), (65° C., 5 minutes), and (65° C., 10 minutes). It is turned out from FIG. 22 that the D concentration is almost uniform in the thick PSZ oxide film being 600 nm in thickness. From this, it is turned out that the diffusion of $D_2O$ (that is, $H_2O$) into the PSZ oxide film is very fast.

From the foregoing, as a mechanism of the oxidation of the PSZ oxide film by $H_2O$, it is considered that $H_2O$ is easily diffused into the PSZ oxide film immersed in the water or warm water, and the $H_2O$ diffused into the PSZ oxide film reacts with the PSZ structure remaining in the PSZ oxide film to cause the oxidation.

After the conversion into the $SiO_2$ film 107 from the $SiO_2$ film 105 by the oxidation treatment using the warm water 201 shown in FIG. 13, the CMP process shown in FIG. 5 is performed, and further, a desired device is formed by a known process similarly to the first embodiment.

Incidentally, according to the conventional method, when a solution containing $H_2O_2$, for example, the $NC_2$ treatment is performed after the CMP process of the PSZ oxide film ($SiO_2$ film) in order to further oxidize the PSZ oxide film ($SiO_2$ film) left in the trench, the upper portion of the PSZ oxide film ($SiO_2$ film) in the trench is etched.

When the upper portion of the PSZ oxide film is etched, it becomes difficult to control the wet etching amount of the PSZ oxide film by dilute hydrofluoric acid. More specifically, the upper portion of the trench is not filled with the PSZ oxide film, and as a consequence, the PSZ oxide film having a favorable shape cannot be obtained.

The above phenomenon is a phenomenon caused by the fact that an oxidizing amount (etching amount) of the PSZ oxide film by NC2 is about several ten times that (about 0.2 nm) of the thermal oxidation film.

In contrast to this, in the case of the present embodiment, the PSZ oxide film ($SiO_2$ film) left in the trench after the CMP process of the PSZ oxide film ($SiO_2$ film) was previously oxidized by the warm water (second oxidation treatment), and therefore, etching of the PSZ oxide film ($SiO_2$ film) does not arise even if the oxidation treatment using $H_2O_2$ solution (for example, $NC_2$ treatmen) is performed. Consequently, there arises no problem of shape control of the STI structure.

Third Embodiment

FIGS. 23 to 29 are sectional views showing a step of manufacturing a semiconductor device according to a third embodiment of the present invention. The present embodiment applies the first embodiment to a NAND type flash memory.

[FIG. 23]

A tunnel oxide film 302 is formed on a silicon substrate 301. The thickness of the tunnel oxide film 302 is about 8 nm. A polycrystalline silicon film to be processed into a floating gate electrode 303 is formed on the tunnel oxide film 302. The thickness of the polycrystalline silicon film is about 150 nm. A $Si_3N_4$ film 304 as a CMP stopper is formed on the polycrystalline silicon film. The thickness of the $Si_3N_4$ film 304 is about 100 nm.

By using an ordinary lithography process and RIE process, the $Si_3N_4$ film 304, the polycrystalline silicon film, the tunnel oxide film 302, and the silicon substrate 301 are processed sequentially, thereby, the floating gate electrode 303 is formed, and further, a trench 305 for STI is formed on a surface of the silicon substrate 301.

[FIG. 24]

To completely fill the trench 305, a perhydrogenated silazane solution is applied on the entire surfaces of the silicon substrate 301, the tunnel oxide film 302, the floating gate electrode 303, and the $Si_3N_4$ film 304. The application of the perhydrogenated silazane solution is performed by using, for example, a spin-coating method. The perhydrogenated silazane solution is, for example, applied in thickness of about 600 nm.

The applied perhydrogenated silazane solution (coating film) is subjected to a baking treatment at 200° C. or lower, for example, about 150° C. for about 3 minutes. By this baking treatment, a solvent of the perhydrogenated silazane solution is vaporized, thereby, a PSZ film 306 is formed.

[FIG. 25]

The PSZ film 306 is subjected to the oxidation treatment for about 30 minutes in a vapor atmosphere at the temperature of higher than 200° C. and not higher than 600° C., for example, at 300° C. This oxidation treatment allows the PSZ film 306 to be converted into a SiO$_2$ film 307.

Here, the temperature of the oxidation treatment in the vapor atmosphere is set to 300° C. However, in the case where the temperature of the oxidation treatment is low, i.e., 600° C. or less, there remains Si—H, N—H, Si—N, or the like in the SiO$_2$ film 307. That is, the SiO$_2$ film 307 is not a perfect SiO$_2$ film.

[FIG. 26]

To convert the SiO$_2$ film 307 to which nothing but an imperfect oxidation is performed, into a perfect SiO$_2$ film which can be polished at high rate by CMP, an oxidation treatment (first oxidation treatment) is first performed in the vapor atmosphere 309. The oxidation treatment is performed in an oxidative furnace. An oxidation temperature (furnace temperature) is 300° C. Next, by lowering the furnace temperature to 150° C. and leaving the SiO$_2$ film 307 in the vapor atmosphere for 15 minutes, the SiO$_2$ film is further subjected to an oxidation treatment (second oxidation treatment) in the vapor atmosphere, thereby, a SiO$_2$ film 308 is obtained.

[FIG. 27]

By using the Si$_3$N$_4$ film 304 as a CMP stopper, the SiO$_2$ film 308 outside of the trench is polished and the surface is flatten by CMP process. At this time, it is confirmed that the endpoint of CMP can be detected on the Si$_3$N$_4$ film 304.

[FIG. 28]

The upper portion of the SiO$_2$ film 308 is removed by wet etching using a dilute hydrofluoric acid. The Si$_3$N$_4$ film 304 is removed by wet etching using phosphoric acid solution. With the upper portion of the SiO$_2$ film 308 removed, the upper portion of the side surface of the floating gate electrode 303 is exposed by, for example, about 100 nm.

[FIG. 29]

A gate interelectrode insulating film 310 is formed on the floating gate electrode 303 and the SiO$_2$ film 308, and a control gate electrode 311 is formed on the gate interelectrode insulating film 310. Thereafter, the known steps such as a step of forming an interlayer insulating film and a step of forming a bit line are performed, and a NAND type flash memory is completed.

As described above, according to the present embodiment, use of the perhydrogenated silazane solution makes it possible to easily form a SiO$_2$ film effective as the insulating film for isolation, particularly a SiO$_2$ film having large CMP rate as compared with the Si$_3$N$_4$ film (CMP stopper). In addition, the same effect as the first embodiment such as prevention of the STI width expansion can be obtained.

Fourth Embodiment

Figure 30:
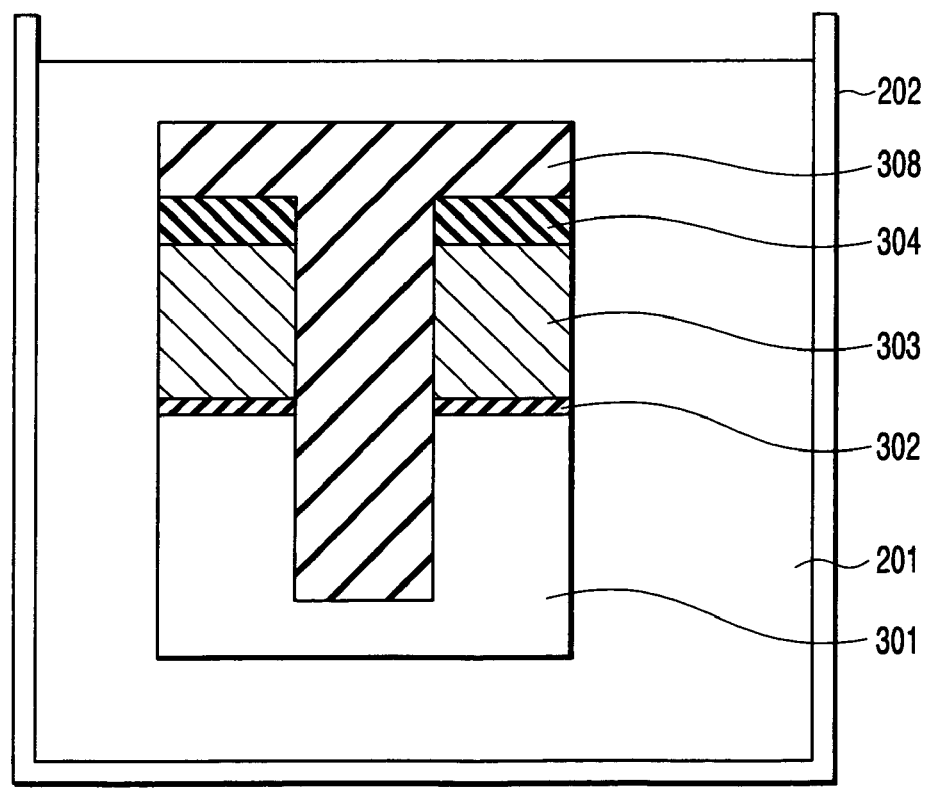
FIG. 30 is a sectional view showing a step of manufacturing a semiconductor device according to a fourth embodiment of the present invention.
Figure 31:
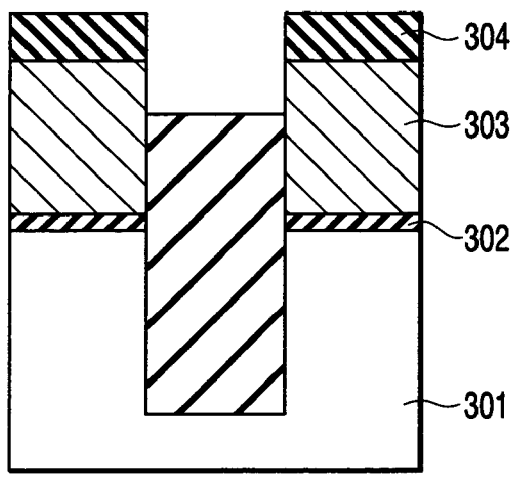
FIG. 31 is a sectional view showing a step of manufacturing the semiconductor device according to the fourth embodiment continued to FIG. 30.

FIGS. 30 and 31 are sectional views showing a step of manufacturing a semiconductor device according to a fourth embodiment of the present invention. The present embodiment applies the second embodiment to a NAND type flash memory. The step common to the NAND type flash memory of the third embodiment will be described with reference to the drawings used in the third embodiment.

Figure 23:
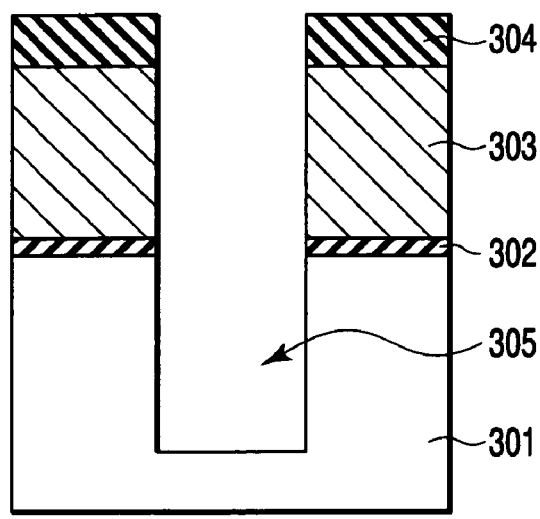
FIG. 23 is a sectional view showing a step of manufacturing a semiconductor device according to a third embodiment of the present invention.
Figure 24:
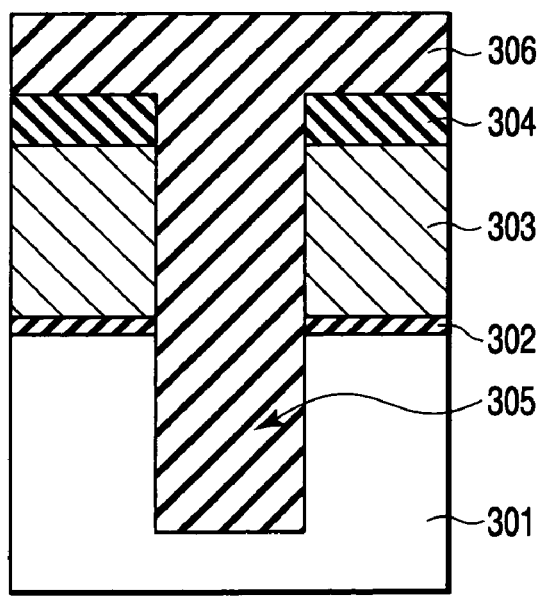
FIG. 24 is a sectional view showing a step of manufacturing the semiconductor device according to the third embodiment continued to FIG. 23.
Figure 25:
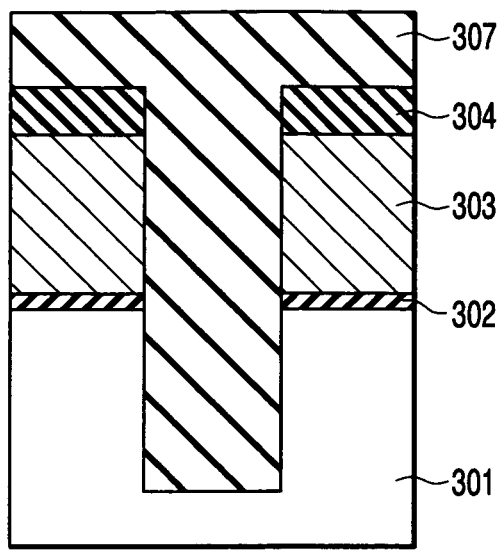
FIG. 25 is a sectional view showing a step of manufacturing the semiconductor device according to the third embodiment continued to FIG. 24.
Figure 26:
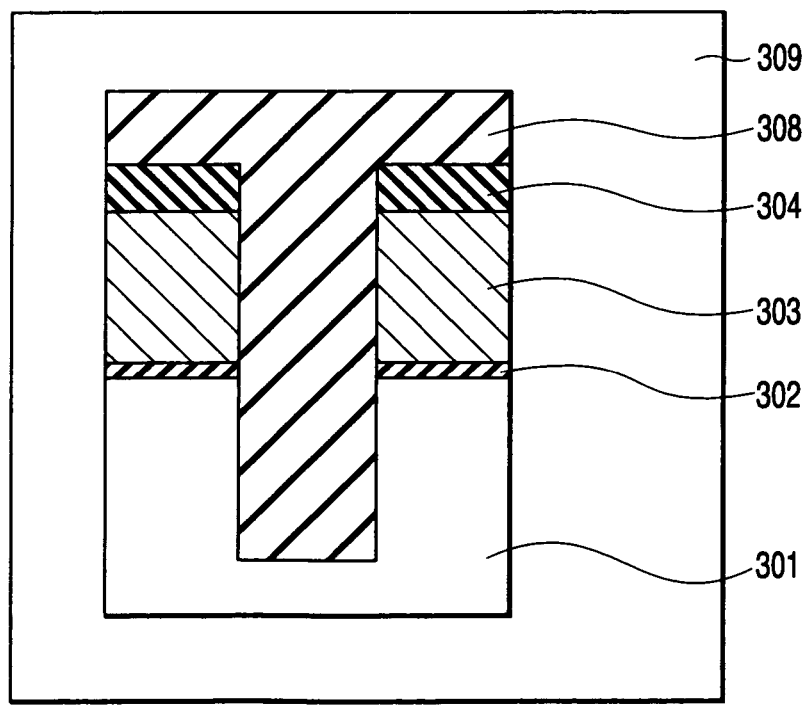
FIG. 26 a sectional view showing a step of manufacturing the semiconductor device according to the third embodiment continued to FIG. 25.

[FIGS. 23 to 25]

First, the steps of FIGS. 23 to 25 described in the third embodiment are performed. A SiO$_2$ film 307 at this stage is an imperfect SiO$_2$ film. For this reason, the CMP rate of the SiO$_2$ film 307 is insufficient.

[FIG. 30]

In the third embodiment, the SiO$_2$ film 307 is converted into the perfect SiO$_2$ film 308 by exposing the SiO$_2$ film 307 in the vapor atmosphere 309. In the present embodiment, however, the SiO$_2$ film 307 is converted into the perfect SiO$_2$ film 308 by immersing the SiO$_2$ film 307 in the warm water 201 of 70° C. for 10 minutes similarly to the second embodiment.

[FIG. 27]

Next, by using the Si$_3$N$_4$ film 304 as a CMP stopper, the SiO$_2$ film 308 outside of the trench is polished and the surface is flatten by CMP process. At this time, it is confirmed that the endpoint of CMP can be detected on the Si$_3$N$_4$ film 304.

[FIG. 31]

The upper portion of the SiO$_2$ film 308 is removed by wet etching using a dilute hydrofluoric acid. With the upper portion of the SiO$_2$ film 308 removed, the upper portion of the side surface of the floating gate electrode 303 is exposed by, for example, about 100 nm.

[FIG. 29]

The Si$_3$N$_4$ film 304 is removed by wet etching using a phosphoric acid solution. A gate interelectrode insulating film 310 is formed on the floating gate electrode 303 and the SiO$_2$ film 308, and further, a control gate electrode 311 is formed on the gate interelectrode insulating film 310. Thereafter, the known steps such as a step of forming an interlayer insulating film and a step of forming a bit line are performed, and a NAND type flash memory is completed.

As described above, according to the present embodiment, use of the perhydrogenated silazane solution makes it possible to easily form a SiO$_2$ film effective as the insulating film for isolation, particularly a SiO$_2$ film having large CMP rate as compared with the Si$_3$N$_4$ film (CMP stopper). In addition, the same effect as the second embodiment can be obtained.

Fifth Embodiment

Figure 32:
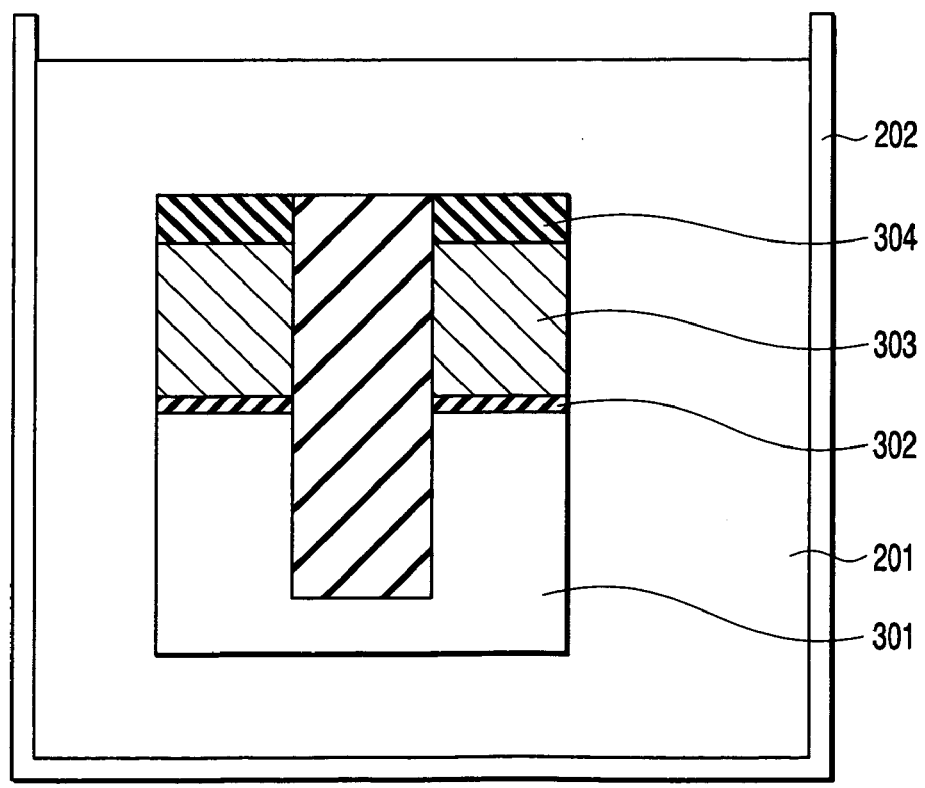
FIG. 32 is a sectional view showing a step of manufacturing a semiconductor device according to a fifth embodiment of the present invention.

FIG. 32 is a sectional view showing a step of manufacturing a semiconductor device according to a fifth embodiment of the present invention.

A common step to the NAND type flash memory of the third embodiment will be described with reference to the drawings used in the third embodiment. The present embodiment is different from the fourth embodiment in that an oxidation treatment with warm water is performed twice.

[FIGS. 23 to 27]

First, the steps of FIGS. 23 to 27 described in the third embodiment are performed.

[FIG. 32]

By immersing a SiO$_2$ film 308 in the warm water 201 of 70° C. for 10 minutes, the SiO$_2$ film 308 is subjected to an oxidation treatment (second warm water treatment). Longer the time for immersing the SiO$_2$ film 308 in the warm water of 70° C. is, higher the in-plane uniformity of the etching rate of the film 308 is. Here, the in-plane uniformity of the etching rate means an in-plane uniformity of etching rate of a plurality of SiO$_2$ films 308 having the same size formed on a silicon substrate (wafer).

Figure 29:
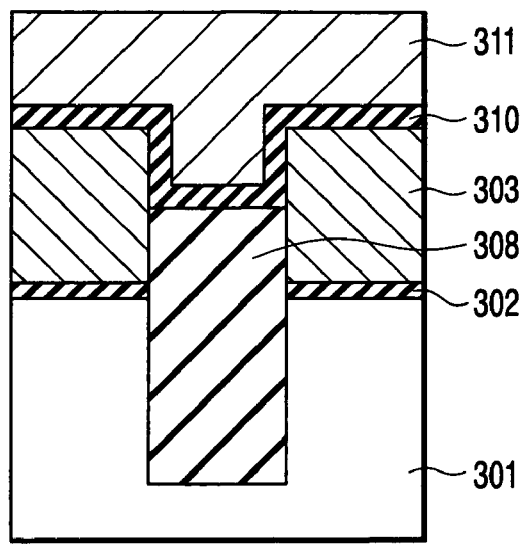
FIG. 29 is a sectional view showing a step of manufacturing the semiconductor device according to the third embodiment continued to FIG. 28.

[FIGS. 28 and 29]

The steps of FIGS. 28 and 29 described in the third embodiment are performed, thereafter, by going through the known steps such as a step of forming an interlayer insulating film and a step of forming a bit line, a NAND type flash memory is completed.

According to the present embodiment, the warm water treatment is performed before and after the CMP process of FIG. 27, so that a SiO$_2$ film 303 having a large CMP rate can be easily formed, and the in-plane uniformity of the etching rate of the SiO$_2$ film 303 can be further improved.

Sixth Embodiment

Figure 33:
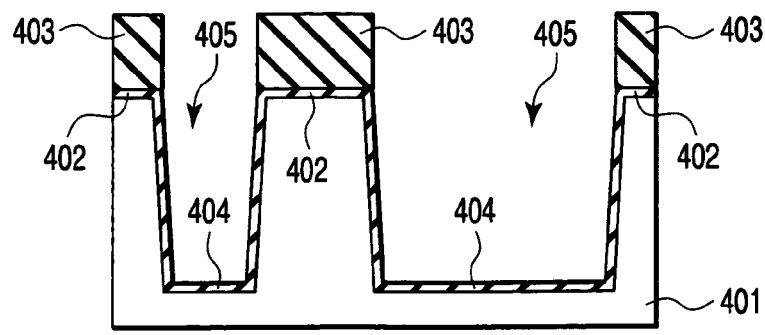
FIG. 33 is a sectional view showing a step of manufacturing a semiconductor device according to a sixth embodiment of the present invention.
Figure 34:
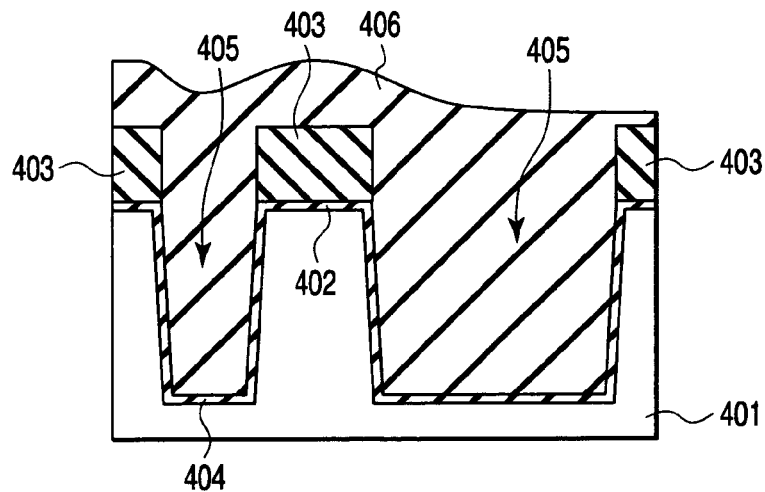
FIG. 34 is a sectional view showing a step of manufacturing the semiconductor device according to the sixth embodiment continued to FIG. 33.
Figure 35:
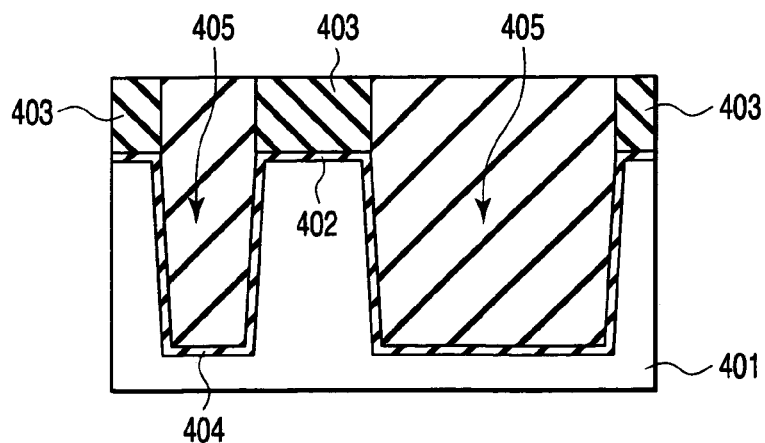
FIG. 35 is a sectional view showing a step of manufacturing the semiconductor device according to the sixth embodiment continued to FIG. 34.
Figure 38:
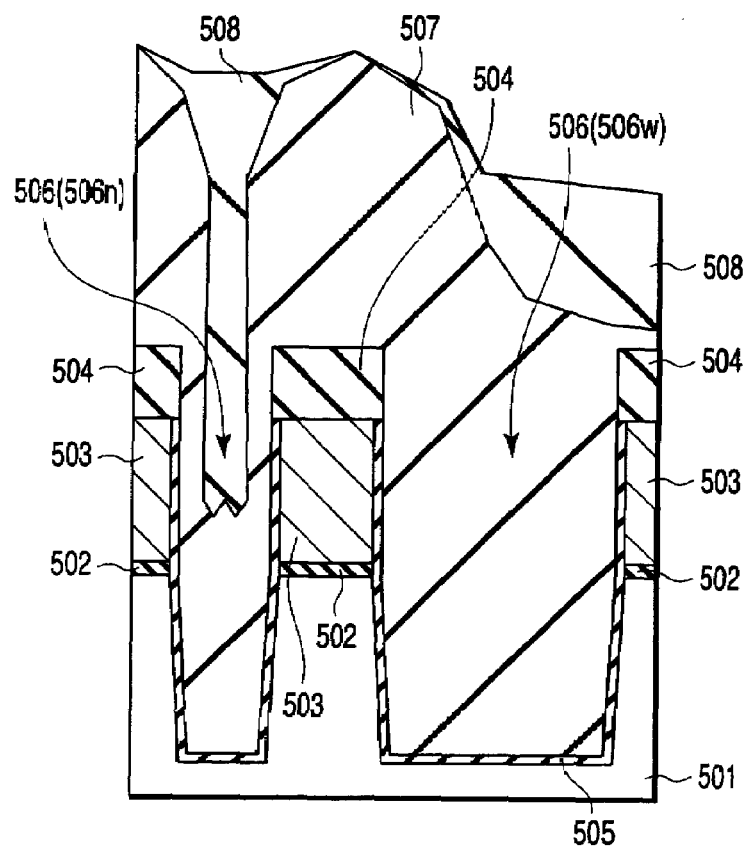
FIG. 38 is a sectional view showing a step of manufacturing the semiconductor device according to the seventh embodiment continued to FIG. 37.
Figure 39:
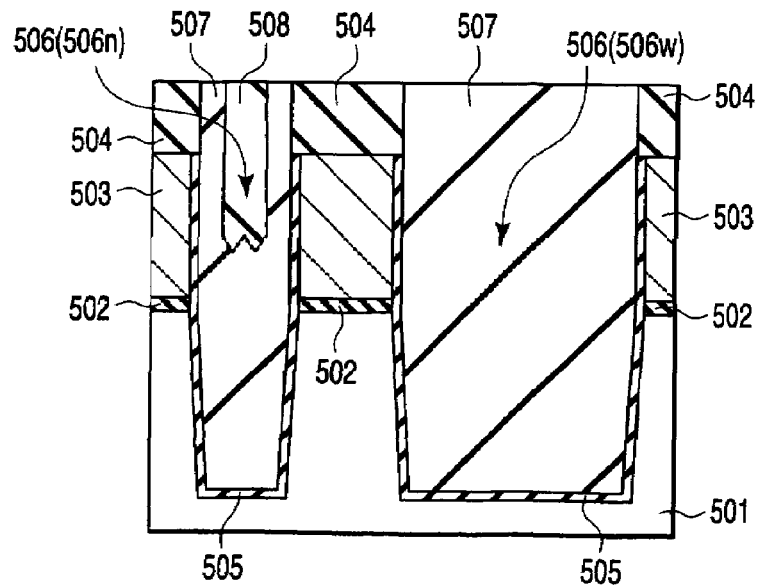
FIG. 39 is a sectional view showing a step of manufacturing the semiconductor device according to the seventh embodiment continued to FIG. 38.

FIGS. 33 to 35 are sectional views showing a step of manufacturing a semiconductor device according to a sixth embodiment of the present invention. In the first to fifth embodiments, the first and second oxidation treatments are performed in order to convert a PSZ film into a silicon oxide film. In the present embodiment, a third oxidation treatment is further performed after the second oxidation treatment. Hereinafter, the method of manufacturing the semiconductor device of the present embodiment will be further described.

[FIG. 33]

A thermal oxidation film 402 is formed on a silicon substrate 401. The thickness of the thermal oxidation film 402 is, for example, 5 nm. A Si$_3$N$_4$ film 403 is formed on the thermal oxidation film 402. The Si$_3$N$_4$ film 403 is used as a polishing stopper at the time of CMP process. The thickness of the Si$_3$N$_4$ film 403 is, for example, about 150 nm. A CVD oxide film (not shown) is formed on the Si$_3$N$_4$ film 403. A photoresist pattern is formed on the CVD oxide film by a lithography process, then, by using this photoresist pattern as a mask, the CVD oxide film is etched by RIE process, thereby, a hard mask made of the CVD oxide film is formed.

The photoresist pattern is removed by etching using asher and a mixed solution of sulfuric acid and hydrogen peroxide. The Si$_3$N$_4$ film 403, the thermal oxidation film 402, and the silicon substrate 401 are etched sequentially by RIE process using the hard mask, thereby, a trench is formed. The depth of this trench is, for example, 300 nm.

The hard mask is selectively removed by hydrofluoric acid vapor. A thermal oxidation film 404 is formed on the inner surface (side surface and bottom surface) of the trench. The thickness of the thermal oxidation film 404 is, for example, 4 nm. In this manner, an isolation trench (hereinafter simply referred to as trench) 405 having the thermal oxidation film 404 formed on the inner surface is obtained.

[FIG. 34]

To completely fill the trench 405, a silicon oxide film (isolation insulating film) 406 is formed on the entire surface of the substrate. Hereinafter, a method of forming the silicon oxide film 406 will be further described.

First, a perhydrosilazane polymer solution is generated by diffusing a perhydrosilazane polymer ((SiH$_2$NH)n) in a solvent such as xylene and butylether, and the perhydrosilazane polymer solution is applied on the entire surface of the substrate by a spin-coating method.

The example of conditions of the spin-coating method is as follows. Rotation rate of the silicon substrate 401 is 4000 rpm, rotation time of the silicon substrate 401 is 30 seconds, dropping amount of the perhydrosilazane polymer solution is 8 cc, and target coating film thickness is 500 nm.

At this time, because of the application of liquid, the trench 405 of a high aspect ratio is filled with coating film containing a perhydrosilazane polymer without generating a void and a seam.

Next, the coating film is subjected to a predetermined heat treatment, thereby, the coating film is converted into the PSZ film having a low concentration of impurity. Specifically, the silicon substrate 401 having the coating film formed thereon is heated at 180° C. on a hot plate and baked for 3 minutes in an inert gas atmosphere, thereby, a solvent in the coating film is vaporized. In the PSZ film thus obtained, carbon or carbon hydride originated from the solvent remains as the impurity to the extent of several percents to several tens percents.

Next, the PSZ film is subjected to first to third oxidation treatments. Hereinafter, the first to third oxidation treatments will be further described.

The first oxidation treatment in a first vapor atmosphere is performed in a diffusion furnace. Specifically, first, the silicon substrate 401 is inserted into the diffusion furnace of the temperature at about 200° C. Next, the temperature in the diffusion furnace is raised from 200° C. to 300° C., and when the temperature reaches 300° C., the temperature is kept on standby for 5 minutes or more for temperature stability, thereafter, vapor is introduced into the diffusion furnace at a pressure of 20 Kpa to 60 Kpa, and a heat treatment for about 30 minutes is performed.

Next, after the first vapor oxidation treatment (first oxidation treatment), a second oxidation treatment is performed in such a manner that the silicon substrate 401 is immersed in water or warm water of 90° C. or lower. By this second oxidation treatment, the oxidation of the PSZ film and the removal of the impurity in the PSZ film progress.

Next, a third oxidation treatment in a second vapor atmosphere is performed in the diffusion furnace. Specifically, first, the silicon substrate 401 is inserted again into the diffusion furnace. The furnace temperature at this time is about 200° C., and the pressure in the furnace is about 20 Kpa to 60 Kpa. Subsequently, the temperature in the furnace is raised up to about 500° C., and a heat treatment is performed for about 30 minutes.

By performing the third treatment after the first and second oxidation treatments, removal of the impurity and densification of film is effectively performed when the PSZ film is converted into the silicon oxide film.

By setting the temperature of the third oxidation treatment higher than the temperature of the first oxidation treatment, the foregoing effect can be further increased.

However, the temperature of the third oxidation treatment is preferably 600° C. or lower. The reason is that if the temperature of the third oxidation treatment exceeds 600° C., the problem of the increase in oxidization amount and the problem of the occurrence of bird's beak are prone to arise. The temperature in the furnace is typically set within a range of 500 to 550° C.

By the first vapor oxidation treatment (first oxidation treatment), the water or warm water treatment (second oxidation treatment), and the second vapor oxidation treatment (third oxidation treatment), impurity carbon or carbon hydride in the PSZ film are more effectively removed, and a part of a Si—N bond in the PSZ film is converted into a Si—O bond. This reaction typically progresses as follows.

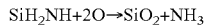

$$SiH_2NH + 2O \rightarrow SiO_2 + NH_3$$

Table 1 shows a comparison between a silicon oxide film formed by subjecting a PSZ film to the first to third oxidation treatments of the present embodiment and a silicon oxide film formed by subjecting a PSZ film to an oxidation treatment of a comparative example (atmosphere: vapor, temperature: 500° C., pressure: 40 Kpa, time: 15 minutes).

TABLE 1

|  | Oxide film thickness on bear Si wafer | C concentration in film |
|---|---|---|
| Silicon oxide film of embodiment | 1.45 nm | $8E^{18}/cm^3$ |
| Silicon oxide film of comparative example | 1.42 nm | $8E^{19}/cm^3$ |

Comparing the silicon oxide film of the present embodiment with the silicon oxide film of the comparative example, the oxide film thickness on a bare silicon wafer taken as a reference of the oxidization amount in the oxidation treatment is substantially the same. However, the C concentration in the silicon oxide film of the embodiment is reduced by about 90% of the C concentration in the silicon oxide film of the comparative example.

Next, annealing at high temperature is performed in order to further densify the silicon oxide film 406. The example of typical conditions is as follows. Atmosphere is dry-oxygen, temperature is 900° C., and time is 30 minutes.

[FIG. 35]

By using the $Si_3N_4$ film 403 as a CMP stopper, the silicon oxide film 406 outside of the trench 405 is removed and the surface is flatten by CMP process.

Next, the $Si_3N_4$ film 403 is removed in hot phosphoric acid, thereafter, a desired device is formed by a known process and a semiconductor device is obtained.

According to the present embodiment, by performing the third oxidation treatment after the first and second oxidation treatments, thereby, removal of the impurity and densification of film are more effectively perform when the PSZ film is converted into the $SiO_2$ film.

Incidentally, in the present embodiment, an example of using the PSZ film alone as a filling film is shown. However, an HDP-CVD silicon oxide film and a PSZ film may be used together. Even in this case, the same effect as the present embodiment can be obtained.

Seventh Embodiment

FIGS. 36 to 39 are sectional views showing a step of manufacturing a semiconductor device according to a seventh embodiment of the present invention.

The present embodiment is an example in the case where a gate (gate oxide film, gate electrode) is formed in advance on a silicon substrate. In the case where the gate is formed in advance, there is an advantage that electric field concentration or the like on a gate edge portion are suppressed. However, a heating step at the STI process may be a cause to generate problems such as heat deterioration of the gate oxide film and occurrence of a bird' beak at the edge portion of the gate oxide film.

The present embodiment shows an example, in which a trench is filed with an HDP-CVD silicon oxide film and a polysilazane film, thereafter, a PSZ film is converted into a silicon oxide film by the first to third oxidation treatments similarly to the six embodiment. Hereinafter, the method of manufacturing the semiconductor device of the present embodiment will be further described.

[FIG. 36]

A gate oxide film 502, a polycrystalline silicon film 503 to be processed into a gate electrode, and a $Si_3N_4$ film 504 are formed on a silicon substrate 501. The $Si_3N_4$ film 504 is used as a polishing stopper at the pf CMP process. A CVD oxide film (not shown) is formed on the entire surface of the substrate. A photoresist pattern is formed on the CVD oxide film by lithography process, then, by using this photoresist pattern as a mask, the CVD oxide film is etched by RIE process, thereby, a hard mask made of the CVD oxide film is formed.

The photoresist pattern is removed by etching using asher and a mixed solution of sulfuric acid and hydrogen peroxide. The $Si_3N_4$ film 504, the polycrystalline silicon film 503, the gate oxide film 502, and the silicon substrate 501 are etched sequentially by RIE process using the hard mask, thereby, a trench is formed. The depth of this trench is, for example, 200 nm.

The hard mask is selectively removed by hydrofluoric acid vapor. A thermal oxidation film 505 is formed on the inner surface (side surface and bottom surface) of the trench. The thickness of the thermal oxidation film 505 is, for example, 4 nm. In this manner, an isolation trench (hereinafter simply referred to as trench) 506 having the thermal oxidation film 505 formed on the inner surface is obtained. Reference numeral 506n denotes a narrow width portion of the trench 506, and reference numeral 506w denotes a wide width portion of the trench 506.

[FIG. 37]

A silicon oxide film (first isolation insulating film) 507 is formed on the entire surface of the substrate by HDP-CVP process. Hereinafter, the silicon oxide film 507 will be referred to as HDP-CVP silicon oxide film 507.

Here, the trench 506w is completely filled with the HDP-CVD silicon oxide film 507. On the other hand, the trench 506n is not completely filled with the HDP-CVD silicon oxide film 507, and there remains a slit-shaped gap. The aspect ratio of this slit-shaped gap is 10 or more. Thus, it is difficult to fill the trench 506n only with the HDP-CVD silicon oxide film 507.

[FIG. 38]

A silicon oxide film (second isolation insulating film) 508 is formed on the entire surface of the substrate. The silicon oxide film 508 is an insulating film formed based on the PSZ film. Hereinafter, a method of forming the silicon oxide film 508 will be further described.

First, the PSZ film is formed on the entire surface of the substrate by spin-coating method. Further details are as follows.

A perhydrosilazane polymer solution is generated by diffusing a perhydrosilazane polymer $((SiH_2NH)n)$ in a solvent such as xylene and butylether, and the perhydrosilazane polymer solution is applied on the entire surface of the substrate bye spin-coating method.

The example of conditions of the spin-coating method is as follows. Rotation rate of the silicon substrate 501 is 4000 rpm, rotation time of the silicon substrate 501 is 30 seconds, dropping amount of the perhydrosilazane polymer solution is 8 cc, and target coating film thickness is 500 nm.

At this time, because of the application of liquid, the trench 506n of a high aspect ratio is filled with coating film containing a perhydrosilazane polymer without generating a void and a seam. That is, the whole inside of the trench 506 is filled with the insulating film (coating film HDP-CVD silicon oxide film).

Next, by subjecting the coating film to a predetermined heat treatment, the coating film is converted into a PSZ film having a low concentration of the impurity. Specifically, the silicon substrate 501 having the coating film formed thereon is heated at 180° C. on a hot plate, further, the substrate 501 is baked for 3 minutes in an inert gas atmosphere, thereby, a solvent in the coating film is vaporized. In the PSZ film thus obtained, carbon or carbon hydride originated from the solvent remains as the impurity to the extent of several percents to several tens percents.

Next, the PSZ film is subjected to first to third oxidation treatments. Hereinafter, the first to third oxidation treatments will be further described.

The first oxidation treatment in a first vapor atmosphere is performed in a diffusion furnace. Specifically, first, the silicon substrate 501 is inserted into the diffusion furnace of the temperature at about 200° C. Next, the temperature inside the diffusion furnace is raised from 200° C. to 300° C., and when the temperature reaches 300° C., the temperature is kept on standby for five minutes or more for temperature stability. Thereafter, vapor is introduced into the diffusion furnace at a pressure of 20 Kpa to 40 Kpa, and a heat treatment for about one hour is performed.

Next, after the first vapor oxidation treatment (first oxidation treatment), a second oxidation treatment is performed in such a manner that the silicon substrate 501 is immersed in water or warm water of 90° C. or lower. By this second oxidation treatment, the oxidation of the PSZ film and the removal of the impurity of the PSZ film progress.

Next, a third oxidation treatment in a second vapor atmosphere is performed in the diffusion furnace. The conditions of the third oxidation treatment are the same as those of the sixth embodiment.

An oxidization amount by the first vapor oxidation treatment (first oxidation treatment), the water or the warm water treatment (second oxidation treatment), and the second vapor oxidation treatment (third oxidation treatment) is 1.5 nm or less in terms of thickness of an oxide film formed on a bare silicon wafer. If the value is to such an extent, heat deterioration of the gate oxide film 502 and occurrence of bird's beak at the edge portion of the gate oxide film 502 are suppressed.

Thereafter, annealing at high temperature is performed in order to further densify the film. The example of typical conditions is as follows. Atmosphere is dry-oxygen, temperature is 900° C., and time is 30 minutes. When the silicon oxide film thus obtained based on the PSZ film was checked, the silicon oxide film was a silicon oxinitride film containing about 2% nitrogen.

[FIG. 39]

By using the $Si_3N_4$ film 504 as a CMP stopper, the HDP-CVD silicon oxide film 507 and the silicon oxide film 508 $Si_3N_4$ film outside of the trench 506 are removed and the surface is flatten by CMP process.

Thereafter, a MOS transistor is formed by a known process, and a semiconductor device comprising the MOS transistor is obtained.

Incidentally, in the present embodiment, an example of using the HDP-CVD silicon oxide film and the PSZ film as the filling film is explained, but the PSZ film may be used alone. Instead of the HDP-CVD silicon oxide film, an HTO film may be used. Even in those cases, the same effect as that of the present embodiment can be obtained.

Further, the third oxidation treatment described in the sixth and seventh embodiments may be performed in the first to fifth embodiments.

While the embodiments of the present invention have been thus described as above, the present invention is not limited to these embodiments. For example, in the embodiments, a description is made on the case of the NAND type flash memory as a specific device. However, the present invention can be also applied to other devices comprising the STI structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming a trench for isolation on a surface of a substrate including a semiconductor substrate;
    filling the trench with a solution containing a perhydrosilazane polymer by applying the solution on the substrate;
    converting the solution into a film containing the perhydrosilazane polymer by heating the solution; and
    converting the film into a silicon dioxide film including heating the film at a first temperature higher than 200° C. and not higher than 600° C. in an atmosphere containing vapor, and heating the film heated at the first temperature at a second temperature lower than the first temperature in an atmosphere containing vapor or in pure water.

2. The method of manufacturing the semiconductor device according to claim 1, wherein the substrate further includes a silicon nitride film formed on the semiconductor substrate, and the trench penetrates the silicon nitride film.

3. The method of manufacturing the semiconductor device according to claim 2, further comprising removing the silicon dioxide film outside of the trench by CMP process by using the silicon nitride film as a poplpishing stopper.

4. The method of manufacturing the semiconductor device according to claim 3, further comprising heating the film heated at the first and second temperatures at a third temperature higher than the first temperature in vapor atmosphere before the removing the silicon dioxide film outside of the trench by CMP process.

5. The method of manufacturing the semiconductor device according to claim 1, wherein the first temperature is higher than 200° C. and not higher than 400° C.

6. The method of manufacturing the semiconductor device according to claim 1, wherein the second temperature is higher than 55° C. when the film heated at the first temperature is heated in the pure water at the second temperature.

7. The method of manufacturing the semiconductor device according to claim 1, wherein width of the trench is 100 nm or less.

8. The method of manufacturing the semiconductor device according to claim 1, wherein width of the trench is 50 nm or less.

9. The method of manufacturing the semiconductor device according to claim 1, further comprising performing a heat-treatment in pure water for the film heated at the first and second temperatures.

10. The method of manufacturing the semiconductor device according to claim 9, wherein the heat-treatment in pure water is performed at a temperature lower than the first temperature.

11. The method of manufacturing the semiconductor device according to claim 9, wherein the substrate further includes a silicon nitride film formed on the semiconductor substrate, and the trench penetrates the silicon nitride film, and further comprising removing the silicon dioxide film outside of the trench by CMP process by using the silicon nitride film as a polishing stopper before the heat-treatment in pure water.

12. A method of manufacturing a semiconductor devices, comprising:
   forming a tunnel insulating film, a conductive film to be processed into a floating gate electrode, and a silicon nitride film on a semiconductor substrate sequentially;
   forming a trench for isolation on a surface of the semiconductor substrate by etching the silicon nitride film, the conductive film, and the tunnel insulating film;
   filling the trench with a solution containing a perhydrosilazane polymer by applying the solution on a semiconductor structure including the semiconductor substrate, the tunnel insulating film, the conductive film and the silicon nitride film;
   converting the solution into a film containing a perhydrosilazane polymer by heating the solution; and
   converting the film into a silicon dioxide film including heating the film at a first temperature higher than 200° C. and not higher than 600° C. in an atmosphere containing vapor; and heating the film heated at the first temperature at a second temperature lower than the first temperature in an atmosphere containing vapor or in pure water.

13. The method of manufacturing the semiconductor device according to claim 12, further comprising removing the silicon dioxide film outside of the trench by CMP process by using the silicon nitride film as a polishing stopper.

14. The method of manufacturing the semiconductor device according to claim 13, further comprising heating the film heated at the first and second temperatures at a third temperature higher than the first temperature in vapor atmosphere before the removing the silicon dioxide film outside of the trench by CMP process.

15. The method of manufacturing the semiconductor device according to claim 12, wherein the second temperature is higher than 55° C. when the film heated at the first temperature in the pure water is heated at the second temperature.

16. The method of manufacturing the semiconductor device according to claim 12, wherein width of the trench is 100 nm or less.

17. The method of manufacturing the semiconductor device according to claim 12, wherein width of the trench is 50 nm or less.

18. The method of manufacturing the semiconductor device according to claim 1, further comprising heating the film heated at the first and second temperatures at a third temperature in an atmosphere containing vapor.

19. The method of manufacturing the semiconductor device according to claim 18, wherein the third temperature is higher than the first temperature.

20. The method of manufacturing the semiconductor device according to claim 19, further comprising performing annealing to densify the silicon dioxide film.

21. The method of manufacturing the semiconductor device according to claim 20, wherein the silicon oxide film is an HTO film.

22. The method of manufacturing the semiconductor device according to claim 19, further comprising heating the film heated at the first, second and third temperatures in pure water.

23. The method of manufacturing the semiconductor device according to claim 18, wherein the third temperature is 500 to 550° C.

24. The method of manufacturing the semiconductor device according to claim 18, wherein the third temperature is 600° C. or lower.

25. The method of manufacturing the semiconductor device according to claim 12, further comprising performing a heat-treatment in pure water for the film heated at the first and second temperatures.

26. The method of manufacturing the semiconductor device according to claim 25, wherein the heat-treatment in pure water is performed at a temperature lower than the first temperature.

27. The method of manufacturing the semiconductor device according to claim 25, further comprising removing the silicon dioxide film outside of the trench by CMP process by using the silicon nitride film as a polishing stopper before the heat-treatment in pure water.

28. The method of manufacturing the semiconductor device according to claim 12, further comprising forming a silicon oxide film by CVD process in the trench such that the trench is not completely filled with the silicon oxide film before the filling the trench with the solution containing the perhydrosilazane polymer.

* * * * *

UNITED STATES PATENT AND TRADEMARK OFFICE
CERTIFICATE OF CORRECTION

PATENT NO. : 7,538,047 B2  Page 1 of 1
APPLICATION NO. : 11/451519
DATED : May 26, 2009
INVENTOR(S) : Kawasaki et al.

It is certified that error appears in the above-identified patent and that said Letters Patent is hereby corrected as shown below:

Claim 3, column 20, line 36, change "poplpishing" to --polishing--.

Claim 12, column 21, line 5, change "devices," to --device,--.

Signed and Sealed this

Fourteenth Day of July, 2009

JOHN DOLL
*Acting Director of the United States Patent and Trademark Office*